US012720884B2

(12) United States Patent
Feng et al.

(10) Patent No.: US 12,720,884 B2
(45) Date of Patent: Aug. 25, 2026

(54) RIDGE RECOGNITION SUBSTRATE AND RIDGE RECOGNITION APPARATUS

(71) Applicants: Beijing BOE Sensor Technology Co., Ltd., Beijing (CN); BOE Technology Group Co., Ltd., Beijing (CN)

(72) Inventors: Yajie Feng, Beijing (CN); Cheng Li, Beijing (CN); Yue Geng, Beijing (CN); Kuiyuan Wang, Beijing (CN); Zhonghuan Li, Beijing (CN); Yi Dai, Beijing (CN); Chaoyang Qi, Beijing (CN); Zefei Li, Beijing (CN); Congcong Xi, Beijing (CN); Xiaoguan Li, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 799 days.

(21) Appl. No.: 18/249,406

(22) PCT Filed: May 26, 2021

(86) PCT No.: PCT/CN2021/096164

§ 371 (c)(1),
(2) Date: Apr. 18, 2023

(87) PCT Pub. No.: WO2022/246713

PCT Pub. Date: Dec. 1, 2022

(65) Prior Publication Data

US 2024/0113140 A1 Apr. 4, 2024

(51) Int. Cl.
*H10F 39/00* (2025.01)

(52) U.S. Cl.
CPC ....... *H10F 39/802* (2025.01); *H10F 39/8057* (2025.01)

(58) Field of Classification Search
CPC ........ H01L 27/14603; H01L 27/14623; G06V 40/1318; G06V 40/1359; H10F 39/802; H10F 39/8057
See application file for complete search history.

(56) References Cited

U.S. PATENT DOCUMENTS

2006/0060899 A1* 3/2006 Hong .................. H10F 39/8057 438/70
2019/0005295 A1* 1/2019 Jia ........................ H10D 86/451
2021/0143192 A1* 5/2021 Chen ..................... H10F 39/802

FOREIGN PATENT DOCUMENTS

CN 111291710 A * 6/2020 ......... G06V 40/1318

OTHER PUBLICATIONS

Geng et al, CN-111291710-A, Machine Translation (Year: 2020).*
(Continued)

*Primary Examiner* — Andres Munoz
(74) *Attorney, Agent, or Firm* — Workman Nydegger

(57) ABSTRACT

A ridge recognition substrate and a ridge recognition apparatus. The ridge recognition substrate includes: a base substrate including a photosensitive area, and a light-shielding area located on at least one side of the photosensitive area; a plurality of photosensitive devices, arranged in the photosensitive area in an array; each photosensitive device includes a first electrode, a photoelectric conversion structure and a second electrode arranged in layers, the photoelectric conversion structure is electrically connected with the first electrode, and the photoelectric conversion structure directly contacts with the second electrode; and dummy devices, arranged in the light-shielding area in an array, each dummy device including a third electrode, an equivalent dielectric layer and a fourth electrode, the third electrode and the first electrode is in the same layer, the fourth electrode
(Continued)

is located at the side of the layer where the second electrode is located facing away from the base substrate.

20 Claims, 20 Drawing Sheets

(56) References Cited

OTHER PUBLICATIONS

PCT/CN2021/096164 Written Opinion of the International Searching Authority (Year: 2022).*
EP21942294—Search Opinion Oct. 20, 2023 (Year: 2023).*

* cited by examiner

RIDGE RECOGNITION SUBSTRATE AND RIDGE RECOGNITION APPARATUS

CROSS-REFERENCE TO RELATED APPLICATION

This application is a national phase entry under 35 U.S.C § 371 of International Application No. PCT/CN2021/096164, filed May 26, 2021, and entitled "RIDGE RECOGNITION SUBSTRATE AND RIDGE RECOGNITION APPARATUS".

FIELD

The present disclosure relates to the technical field of line recognition, in particular to a line recognition substrate and a line recognition apparatus.

BACKGROUND

As the information industry develops at a high speed, the biological recognition technology has been used more and more widely. Particularly, since skin lines, such as fingerprints or palm prints, facilitate user identity confirmation due to uniqueness, the line recognition technology has been used extensively in various fields such as mobile terminals and smart homes to guarantee security for user information.

SUMMARY

Embodiments of the present disclosure provide a line recognition substrate and a line recognition apparatus, and the specific solutions are as follows.

In an aspect, embodiments of the present disclosure provide a line recognition substrate, including:

a base substrate, including a photosensitive region and a light-shielding region, the light-shielding region is located on at least one side of the photosensitive region;

a plurality of photo sensors, arranged in an array at the photosensitive region, each photo sensor including a first electrode, a photoelectric conversion structure, and a second electrode arranged in layers; the photoelectric conversion structure is electrically connected with the first electrode and the photoelectric conversion structure directly contacts with the second electrode; and a plurality of dummy devices, arranged in an array at the light-shielding region, each dummy device including a third electrode, an equivalent dielectric layer, and a fourth electrode; the third electrode and the first electrode are located at a same layer, the fourth electrode is located on a side, facing away from the base substrate, of a layer on which the second electrode is located, the equivalent dielectric layer is disposed between a layer on which the third electrode is located and a layer on which the fourth electrode is located, and plurality of the dummy devices are configured to not perform photoelectric conversion.

Optionally, the above line recognition substrate provided by the embodiments of the present disclosure further includes: a first insulating layer, a planarization layer, and a second insulating layer;

the first insulating layer is disposed between the equivalent dielectric layer and the layer on which the third electrode is located; the second insulating layer is disposed between the equivalent dielectric layer and the layer on which the fourth electrode is located; and the planarization layer is disposed between the first insulating layer and the second insulating layer.

Optionally, in the above line recognition substrate provided by the embodiment of the present disclosure, the equivalent dielectric layer is separated from at least one of the third electrode or the fourth electrode.

Optionally, in the above line recognition substrate provided by the embodiments of the present disclosure, at the light-shielding region, the first insulating layer includes a first via hole, the planarization layer includes a second via hole, and the second insulating layer fills the second via hole;

the equivalent dielectric layer contacts with the third electrode through the first via hole, and the equivalent dielectric layer is separated from the fourth electrode by the second insulating layer.

Optionally, in the above line recognition substrate provided by the embodiments of the present disclosure, at the light-shielding region, the planarization layer includes a second via hole, and the second insulating layer fills the second via hole;

the equivalent dielectric layer is separated from the third electrode by the first insulating layer, and the equivalent dielectric layer is separated from the fourth electrode by the second insulating layer.

Optionally, in the above line recognition substrate provided by the embodiments of the present disclosure, at the light-shielding region, the first insulating layer includes a first via hole;

the equivalent dielectric layer contacts with the third electrode through the first via hole, and the equivalent dielectric layer is separated from the fourth electrode by the planarization layer and the second insulating layer.

Optionally, in the above line recognition substrate provided by the embodiments of the present disclosure, the equivalent dielectric layer is separated from the third electrode by the first insulating layer, and the equivalent dielectric layer is separated from the fourth electrode by the planarization layer and the second insulating layer.

Optionally, in the above line recognition substrate provided by the embodiments of the present disclosure, at the light-shielding region, the second insulating layer includes a third via hole, and the fourth electrode fills the third via hole;

the equivalent dielectric layer is separated from the third electrode by the first insulating layer, and the equivalent dielectric layer is separated from the fourth electrode by the planarization layer.

Optionally, in the above line recognition substrate provided by the embodiments of the present disclosure, a dielectric constant of the equivalent dielectric layer is approximately the same as a dielectric constant of the photoelectric conversion structure.

Optionally, in the above line recognition substrate provided by the embodiments of the present disclosure, the equivalent dielectric layer and the photoelectric conversion structure are located at a same layer and made of a same material.

Optionally, in the above line recognition substrate provided by the embodiments of the present disclosure, the equivalent dielectric layer and the photoelectric conversion structure are located at a same layer, but made of different materials, and the dielectric constant of the equivalent dielectric layer is 10-15.

Optionally, in the above line recognition substrate provided by the embodiments of the present disclosure, at the light-shielding region, the first insulating layer includes a first via hole, the second insulating layer includes a third via hole, and the fourth electrode fills the third via hole;

the planarization layer contacts with the third electrode through the first via hole, and the planarization layer contacts with the fourth electrode through the third via hole.

Optionally, in the above line recognition substrate provided by the embodiments of the present disclosure, at the light-shielding region, the first insulating layer includes a first via hole;

the planarization layer contacts with the third electrode through the first via hole, and the planarization layer is separated from the fourth electrode by the second insulating layer.

Optionally, in the above line recognition substrate provided by the embodiments of the present disclosure, at the light-shielding region, the second insulating layer includes a third via hole, and the fourth electrode fills the third via hole;

the planarization layer is separated from the third electrode by the first insulating layer, and the planarization layer contacts with the fourth electrode through the third via hole.

Optionally, in the above line recognition substrate provided by the embodiments of the present disclosure, at the light-shielding region, the planarization layer is separated from the third electrode by the first insulating layer, and the planarization layer is separated from the fourth electrode by the second insulating layer.

Optionally, in the above line recognition substrate provided by the embodiments of the present disclosure, the planarization layer is multiplexed as the equivalent dielectric layer.

Optionally, in the above line recognition substrate provided by the embodiments of the present disclosure, at the light-shielding region, the planarization layer includes a second via hole, and the second insulating layer fills the second via hole;

the second insulating layer is separated from the third electrode by the first insulating layer, and the second insulating layer directly contacts with the fourth electrode.

Optionally, in the above line recognition substrate provided by the embodiments of the present disclosure, at the light-shielding region, the first insulating layer includes a first via hole, the planarization layer includes a second via hole, the first via hole communicates with the second via hole, and the second insulating layer fills the first via hole and the second via hole;

the second insulating layer contacts with the third electrode through the first via hole and the second via hole, and the second insulating layer directly contacts with the fourth electrode.

Optionally, in the above line recognition substrate provided by the embodiments of the present disclosure, the second insulating layer is multiplexed as the equivalent dielectric layer.

Optionally, the above line recognition substrate provided by the embodiments of the present disclosure further includes a bias wire located at a side of the second insulating layer facing away from the base substrate;

the fourth electrode and the bias wire are located at a same layer and made of a same material, and the third electrode and the first electrode are made of a same material.

Optionally, the above line recognition substrate provided by the embodiments of the present disclosure further includes a light-shielding layer; the light-shielding layer is located at a side of the base substrate facing away from a layer on which the plurality of dummy devices are located, and covers at least one row of the dummy devices.

Optionally, in the above line recognition substrate provided by the embodiments of the present disclosure, the light-shielding layer covers other rows of the dummy devices except one row of the dummy devices adjacent to the photosensitive region.

Optionally, the above line recognition substrate provided by the embodiments of the present disclosure further includes an alignment marker located at the light-shielding region;

the light-shielding layer includes a hollowed structure exposing the alignment marker.

Optionally, the above line recognition substrate provided by the embodiments of the present disclosure further includes a light-shielding metal layer and a transistor; the light-shielding metal layer is located at a side, facing away from the base substrate, of a layer on which the fourth electrode is located, and the transistor is located between a layer on which the photoelectric conversion structure is located and the base substrate, and source and drain electrodes of the transistor are electrically connected with the first electrode or the third electrode;

an orthographic projection of the light-shielding metal layer on the base substrate overlays an orthographic projection of the transistor on the base substrate, and the orthographic projection of the light-shielding metal layer on the base substrate does not overlap with orthographic projections of the dummy device and the photo sensor on the base substrate.

In another aspect, the embodiments of the present disclosure provide a line recognition apparatus including a backlight module and a line recognition substrate; the line recognition substrate is the above line recognition substrate, and the line recognition substrate is located at a light emitting side of the backlight module.

DETAILED DESCRIPTION OF THE EMBODIMENTS

Figure 1:
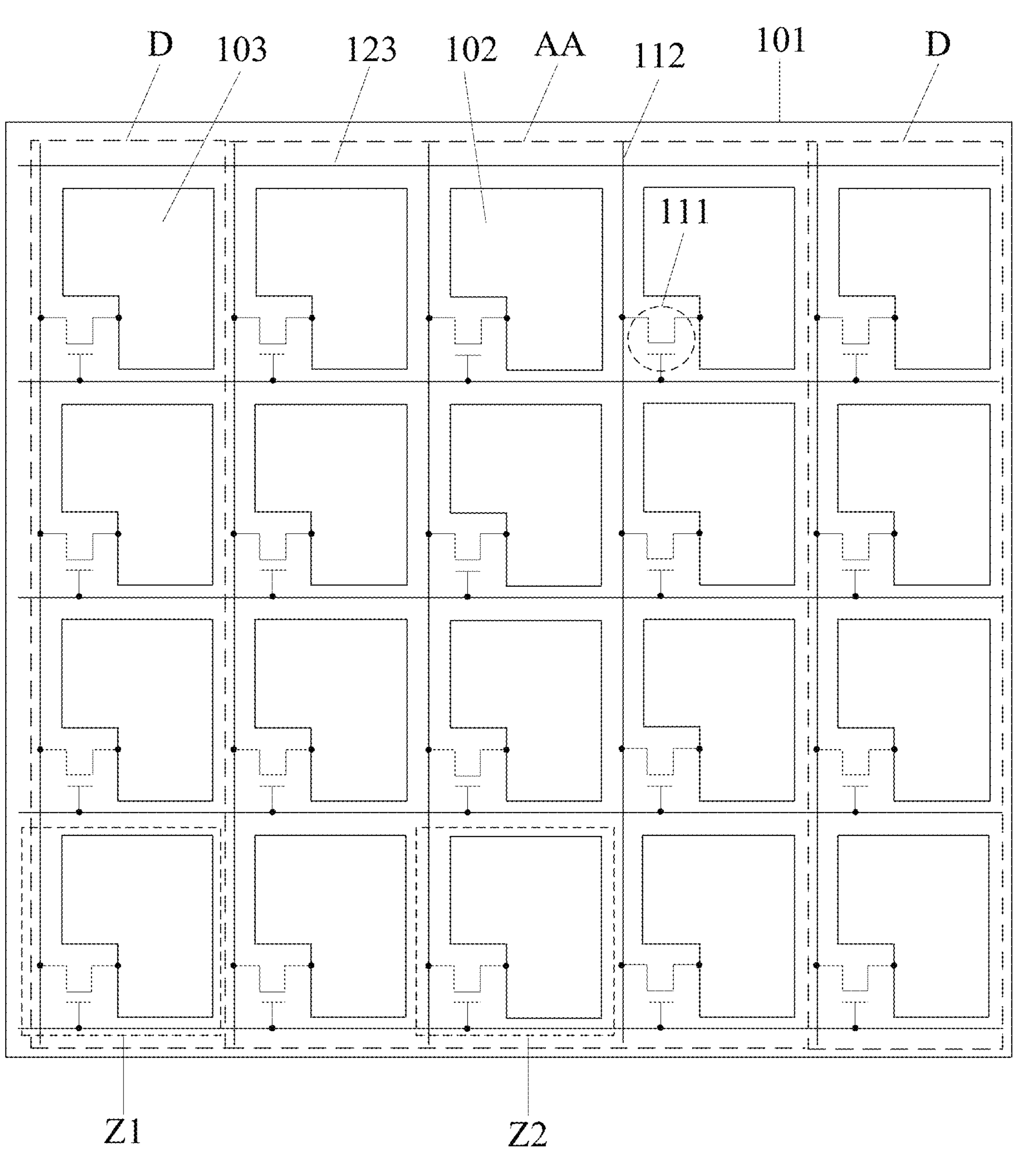
FIG. 1 is a schematic structural diagram of a line recognition substrate according to an embodiment of the present disclosure.

In order to make the objectives, technical solutions and advantages of embodiments of the present disclosure clearer, the technical solutions of the embodiments of the preset disclosure will be described clearly and completely below with reference to the drawings of the embodiments of the present disclosure. It should be noted that sizes and shapes of all figures in the drawings do not reflect a true scale and are only intended to illustrate contents of the present disclosure. Same or similar reference numerals denote same or similar elements or elements with same or similar functions all the way. Apparently, the described embodiments are some, not all, of the embodiments of the present disclosure. Based on the described embodiments of the present disclosure, all other embodiments obtained by those of ordinary skill in the art without creative efforts fall within the protection scope of the present disclosure.

Unless otherwise defined, technical or scientific terms used herein shall have the ordinary meaning as understood by those of ordinary skill in the art to which the present disclosure belongs. "First", "second" and similar words used in the description and the claims of the present disclosure do not represent any order, quantity, or importance, but are merely used to distinguish different components. "Include" or "comprise" and other similar words mean that an element or an item preceding the word covers elements or items and their equivalents listed after the word without excluding other elements or items. "Inner", "outer", "upper", "lower", or the like are only used to indicate a relative positional relationship, and when an absolute position of a described object changes, the relative positional relationship may also change accordingly.

Optical fingerprint recognition is one of the means to achieve fingerprint recognition. The principle of the optical fingerprint recognition is as follows: when a finger is placed over a fingerprint recognition product, the emitted light from a backlight source included in the fingerprint recognition product is directed to valleys and ridges of the finger, is reflected by the valleys and the ridges of the finger and then is incident on a photo sensor included in the fingerprint recognition product. Since the intensities of light reflected by the valleys and the ridges are different, the photo sensor generates different electrical signals according to the differences in the intensities of the reflected light described above, thereby achieving fingerprint recognition.

However, frequent switching on and off of a transistor controlling the photo sensor may cause relatively loud transverse noise (i.e., noise caused by a gate of the transistor), which can severely affect fingerprint imaging quality. Meanwhile, light illumination on the transistor also causes illumination noise, which also affects fingerprint imaging quality.

In order to solve the problem of poor fingerprint imaging quality caused by loud transverse noise and illumination noise, in the related art, a fingerprint recognition product is divided into a photosensitive region (AA) and a light-shielding region (Dummy), and photo sensors in the light-shielding layer, and transistors in the photosensitive region and the light-shielding region are shielded by a light-shielding metal layer. Since no light is received by the shielded transistors, the influences of the illumination noise on the transistors are directly filtered out. In addition, since the photo sensors in the light-shielding region do not perform photoelectric conversion, the output current in the light-shielding region is caused by the transverse noise of the transistors. Based on this, the output current of the photo sensors in the photosensitive region may be calibrated using the output current of the photo sensor in the light-shielding region as a reference value, which filters out the transverse noise and the illumination noise, thereby improving fingerprint imaging quality.

Although the above solution in the related art is not affected by ambient light from above, since the light-shielding metal layer has certain reflectivity, the light emitted from the backlight is reflected after passing through a light-transmitting region to reach the light-shielding metal layer, and the light reflected by the light-shielding metal layer is scattered to the photo sensors by respective coating layers, so that the photo sensors in the light-shielding region is affected by light, resulting in saturation of the gray level of captured images and an inability of accurately reflecting fluctuations in dark noise.

In order to at least solve the above technical problems existing in the related art, embodiments of the present disclosure provide a line recognition substrate, as shown in FIGS. 1 to 4, which may include:

- a base substrate 101, including a photosensitive region AA and a light-shielding region D, the light-shielding region D is located on at least one side of the photosensitive region AA;
- a plurality of photo sensors 102, arranged in an array at the photosensitive region AA, each photo sensor 102 including a first electrode 1021, a photoelectric conversion structure 1022, and a second electrode 1023 arranged in layers; the photoelectric conversion structure 1022 is electrically connected with the first electrode 1021 and the photoelectric conversion structure 1022 directly contacts with the second electrode 1023; and
- a plurality of dummy devices 103, arranged in an array at the light-shielding region D, each dummy device 103 including a third electrode 1031, an equivalent dielectric layer 1032 and a fourth electrode 1033; the third electrode 1031 and the first electrode 1021 are located at the same layer, the fourth electrode 1033 is located at a side, facing away from the base substrate 101, of a layer on which the second electrode 1023 is located, the equivalent dielectric layer 1032 is disposed between a layer on which the third electrode 1031 is located and a layer on which the fourth electrode 1033 is located, and the dummy devices 103 are configured to not perform photoelectric conversion.

In the above line recognition substrate provided by the embodiments of the present disclosure, the third electrode 1031, the equivalent dielectric layer 1032 and the fourth electrode 1033 included in each dummy device 103 equivalently play the role of a capacitor, and the dummy device 103 does not have a photoelectric conversion function, so that the dummy device 103 is not affected by any light, and further the output current of the photo sensor 102 can be calibrated using the output current of the dummy device 103, thereby removing dark noise and improving the image quality of lines (e.g., fingerprints, palm prints, etc.).

In some embodiments, the above line recognition substrate provided by the embodiments of the present disclosure, as shown in FIGS. 3 to 14, may further include: a first insulating layer 104, a planarization layer 105, and a second insulating layer 106; the first insulating layer 104 is disposed between the equivalent dielectric layer 1032 and a layer on which the third electrode 1031 is located, the second insulating layer 106 is disposed between the equivalent dielectric layer 1032 and a layer on which the fourth electrode 1033 is located, and the planarization layer 105 is disposed between the first insulating layer 104 and the second insulating layer 106.

In some embodiments, in the above line recognition substrate provided by the embodiments of the present disclosure, in order to guarantee that each dummy device 103 does not produce the photoelectric conversion effect, the equivalent dielectric layer 1032 may be separated from at least one of the third electrode 1031 or the fourth electrode 1033, as shown in FIGS. 4 to 8.

Figure 4:
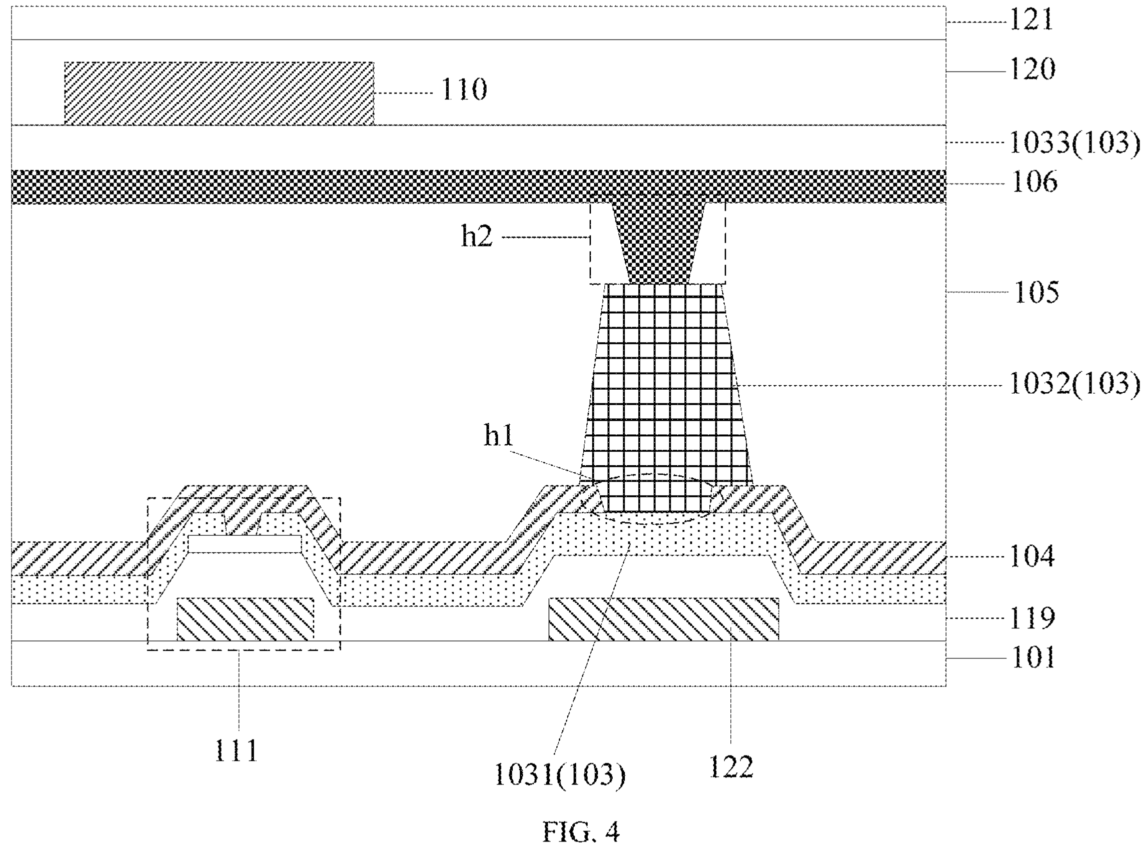
FIG. 4 is another section view along line I-II in FIG. 2.

In some embodiments, in the above line recognition substrate provided by the embodiments of the present disclosure, as shown in FIG. 4, at the light-shielding region D, the first insulating layer 104 may include a first via hole h1, the planarization layer 105 may include a second via hole h2, the second insulating layer 106 fills the second via hole h2, and a surface of a side of the second insulating layer 106 facing away from the base substrate 101 is smoother. The equivalent dielectric layer 1032 may contact with the third electrode 1031 through the first via hole h1, and the equivalent dielectric layer 1032 may be separated from the fourth electrode 1033 by the second insulating layer 106, thereby ensuring that the dummy device 103 does not function as photoelectric conversion.

Figure 5:
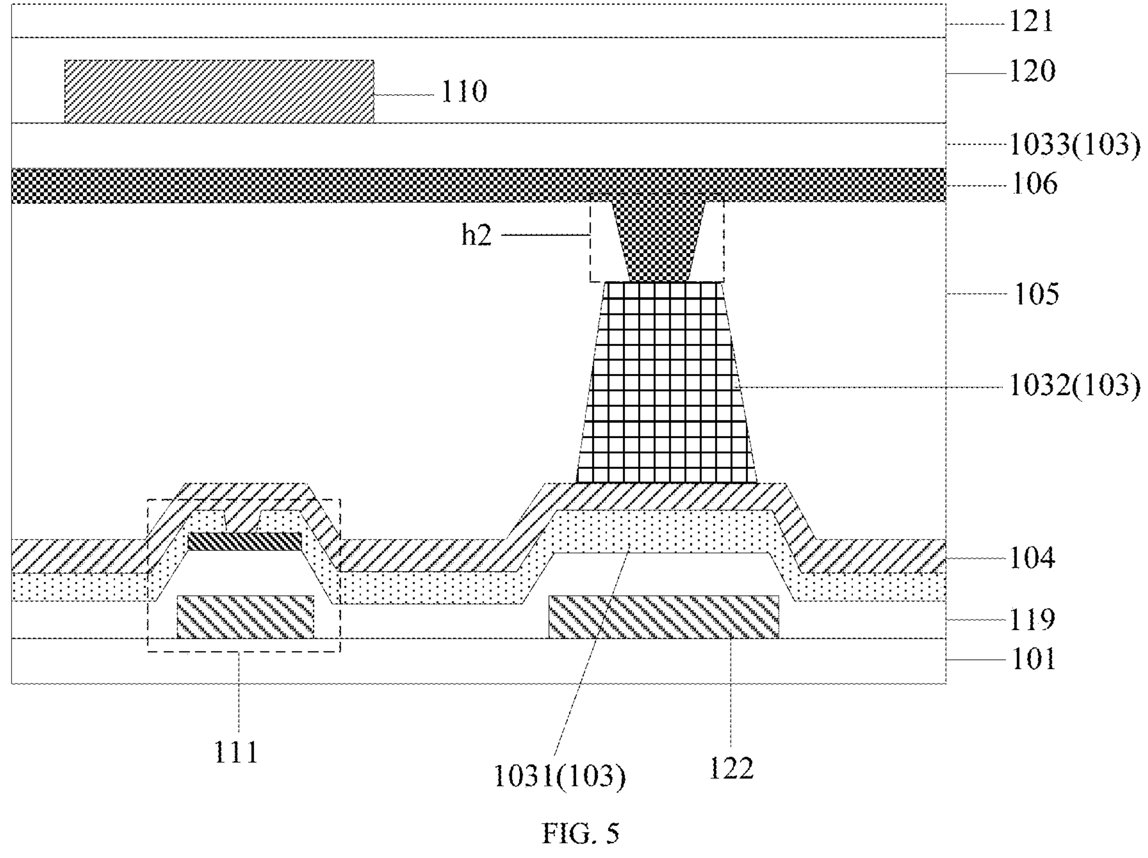
FIG. 5 is another section view along line I-II in FIG. 2.

In some embodiments, in the above line recognition substrate provided by the embodiments of the present disclosure, as shown in FIG. 5, at the light-shielding region D, the planarization layer 105 may include a second via hole h2, the second insulating layer 106 fills the second via hole h2, and a surface of a side of the second insulating layer 106 facing away from the base substrate 101 is smoother. The equivalent dielectric layer 1032 may be separated from the third electrode 1031 by the first insulating layer 104, and the equivalent dielectric layer 1032 may be separated from the fourth electrode 1033 by the second insulating layer 106, thereby ensuring that the dummy device 103 does not function as photoelectric conversion.

Figure 6:
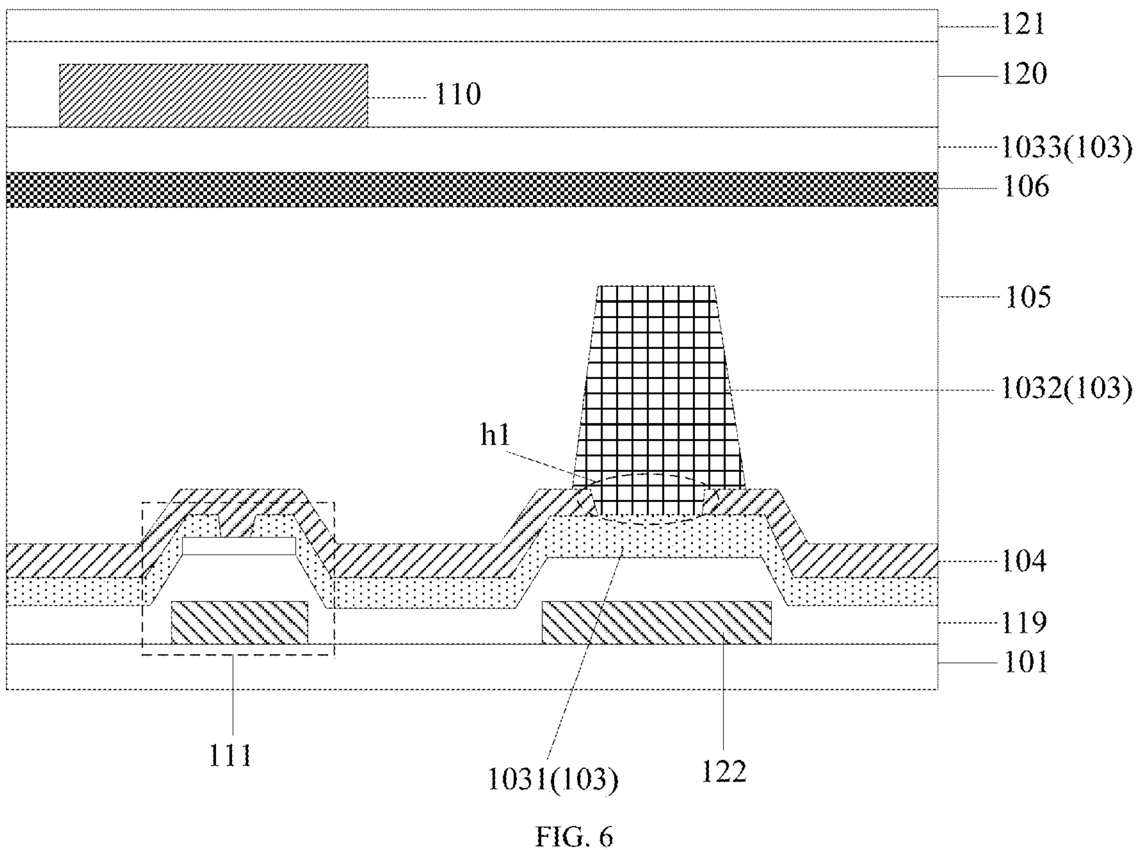
FIG. 6 is another section view along line I-II in FIG. 2.

In some embodiments, in the above line recognition substrate provided by the embodiments of the present disclosure, as shown in FIG. 6, at the light-shielding region D, the first insulating layer 104 may include a first via hole h1, the equivalent dielectric layer 1032 may contact with the third electrode 1031 through the first via hole h1, and the equivalent dielectric layer 1032 may be separated from the fourth electrode 1033 by the planarization layer 105 and the second insulating layer 106, thereby ensuring that the dummy device 103 does not function as photoelectric conversion.

Figure 7:
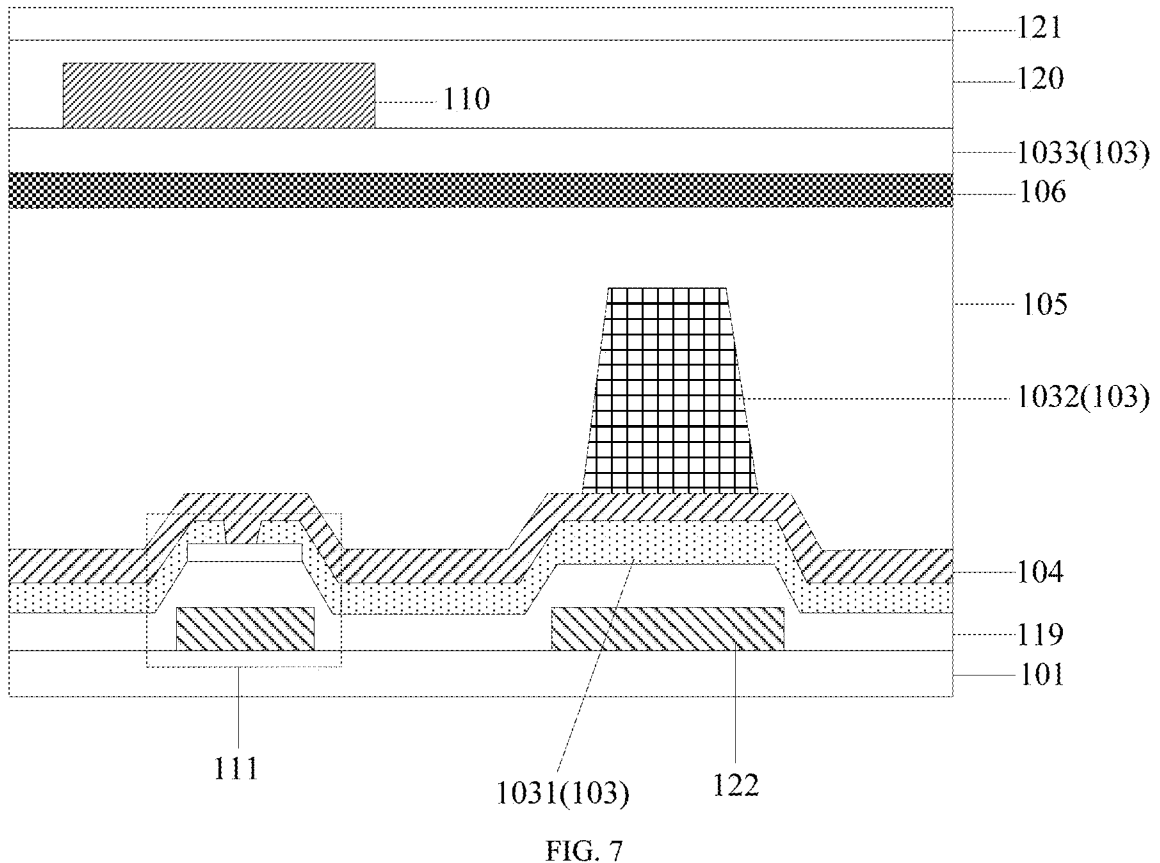
FIG. 7 is another section view along line I-II in FIG. 2.

In some embodiments, in the above line recognition substrate provided by the embodiments of the present disclosure, as shown in FIG. 7, at the light-shielding region D, the equivalent dielectric layer 1032 may be separated from the third electrode 1031 by the first insulating layer 104, and the equivalent dielectric layer 1032 may be separated from the fourth electrode 1033 by the planarization layer 105 and the second insulating layer 106, thereby ensuring that the dummy device 103 does not function as photoelectric conversion.

Figure 8:
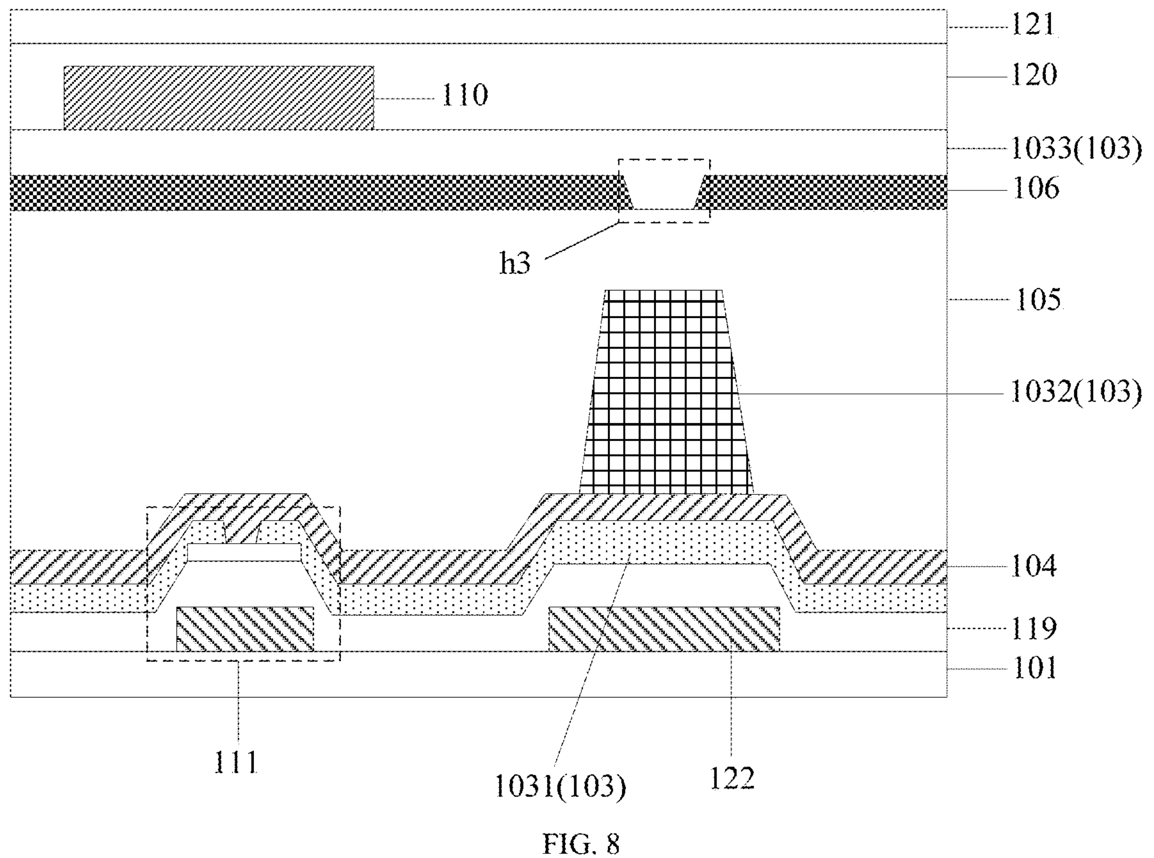
FIG. 8 is another section view along line I-II in FIG. 2.

In some embodiments, in the above line recognition substrate provided by the embodiments of the present disclosure, as shown in FIG. 8, the second insulating layer 106 may include a third via hole h3, and the fourth electrode 1033 fills the third via hole h3. The equivalent dielectric layer 1032 may be separated from the third electrode 1031 by the first insulating layer 104, and the equivalent dielectric layer 1032 may be separated from the fourth electrode 1033 by the planarization layer 105, thereby ensuring that the dummy device 103 does not function as photoelectric conversion.

In some embodiments, in the above line recognition substrate provided by the embodiments of the present disclosure, a dielectric constant of the equivalent dielectric layer 1032 may be approximately the same as a dielectric constant of the photoelectric conversion structure 1022 in order to make the dark noise of the dummy device 103 approximately the same as the dark noise of the photo sensor 102.

In addition, in some embodiments, the photoelectric conversion structure 1022 may be a PN structure or may also be a PIN structure. Specifically, the PIN structure includes an N-type semiconductor layer having an N-type impurity, an intrinsic semiconductor layer I having no impurity, and a P-type semiconductor layer having a P-type impurity, which are disposed in a stack; the thickness of the intrinsic semiconductor layer I may be greater than the thickness of the P-type semiconductor layer and the thickness of the N-type semiconductor layer. When the photoelectric conversion structure 1022 is the PIN structure, the thickness of the P-type semiconductor layer and the thickness of the N-type semiconductor layer are both less than the thickness of the intrinsic semiconductor layer I, so that the dielectric constant of the equivalent dielectric layer 1032 can be set on the basis of the dielectric constant of the intrinsic semiconductor layer I. That is, to simplify the design, the dielectric constant of the equivalent dielectric layer 1032 can be approximately equal to the dielectric constant of the intrinsic semiconductor layer I.

It should be noted that, in the above line recognition substrate provided by the embodiments of the present disclosure, the above "approximately" may indicate complete equivalence or may also indicate the presence of slight deviation due to limitations of process conditions or influences caused by other factors such as measurement. Therefore, the "approximate" relationships between the above features all fall within the scope of protection of the present disclosure as long as the error (e.g., about 10% fluctuation) is allowed.

In some embodiments, in the above line recognition substrate provided by the embodiments of the present disclosure, the equivalent dielectric layer 1032 and the photoelectric conversion structure 1022 are located in the same layer and made of the same material; or, the equivalent dielectric layer 1032 and the photoelectric conversion structure 1022 are located in the same layer, but made of different materials, and the dielectric constant of the equivalent dielectric layer 1032 may be 10-15.

Figure 9:
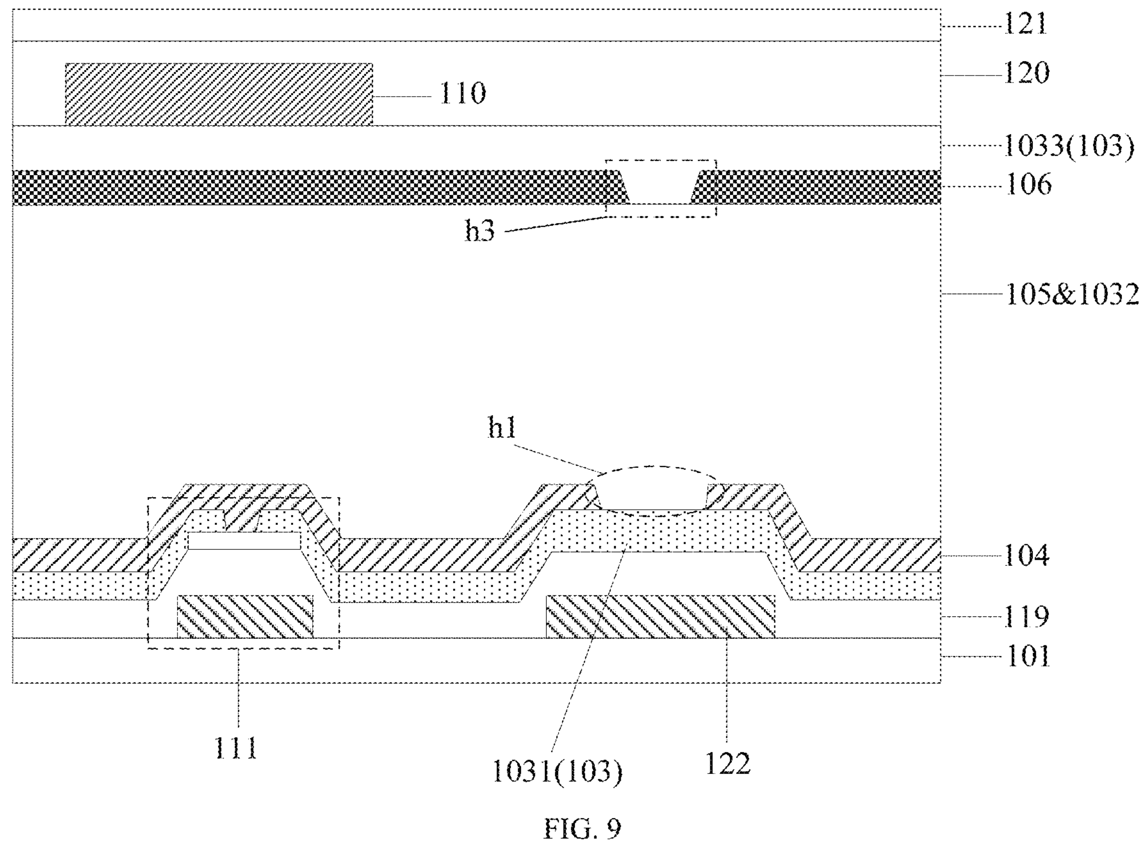
FIG. 9 is another section view along line I-II in FIG. 2.

Since the equivalent dielectric layer 1032 is separated from at least one of the third electrode 1031 or the fourth electrode 1033, the equivalent dielectric layers 1032 are made of the same material as or a different material from the photoelectric conversion structure 1022 all cannot perform photoelectric conversion normally. Moreover, the number of coating layers can be reduced by arranging the equivalent dielectric layer 1032 and the photoelectric conversion structure 1022 in the same layer, which facilitates the light and thin design of a product. In some embodiments, in the above line recognition substrate provided by the embodiments of the present disclosure, as shown in FIG. 9, at the light-shielding region D, the first insulating layer 104 may include a first via hole h1, the second insulating layer 106 may include a third via hole h3, and the fourth electrode 1033 fills the third via hole h3. The planarization layer 105 may contact with the third electrode 1031 through the first via hole h1, and the planarization layer 105 may contact with the fourth electrode 1033 through the third via hole h3. In this case, the planarization layer 105 may be multiplexed as the equivalent dielectric layer 1032, and since the material of the planarization layer 105 does not have a photoelectric conversion function, it may be guaranteed that the dummy device 103 cannot perform photoelectric conversion. Moreover, the planarization layer 105 in the related art is multiplexed as the equivalent dielectric layer 1032 may avoid making the equivalent dielectric layer 1032 separately, to simplify the preparation process, improve production efficiency, and save production costs.

Figure 10:
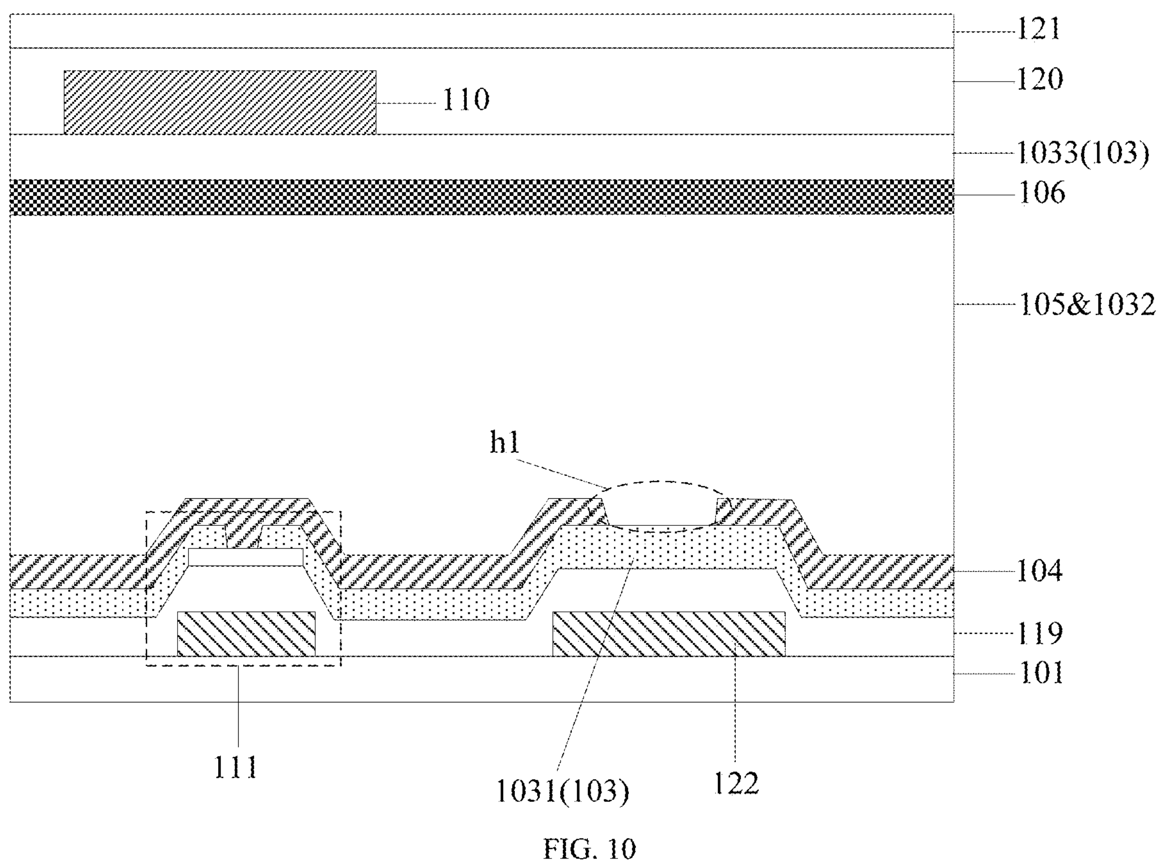
FIG. 10 is another section view along line I-II in FIG. 2.

In some embodiments, in the above line recognition substrate provided by the embodiments of the present disclosure, as shown in FIG. 10, at the light-shielding region D, the first insulating layer 104 may include a first via hole h1, the planarization layer 105 may contact with the third electrode 1031 through the first via hole h1, and the planarization layer 105 may be separated from the fourth electrode 1033 by the second insulating layer 106. In this case, the planarization layer 105 may be multiplexed as the equivalent dielectric layer 1032, and since the material of the planarization layer 105 does not have a photoelectric conversion function, it may be guaranteed that the dummy device 103 cannot perform photoelectric conversion. Moreover, the planarization layer 105 in the related art is multiplexed as the equivalent dielectric layer 1032 may avoid making the equivalent dielectric layer 1032 separately, to simplify the preparation process, improve production efficiency, and save production costs.

Figure 11:
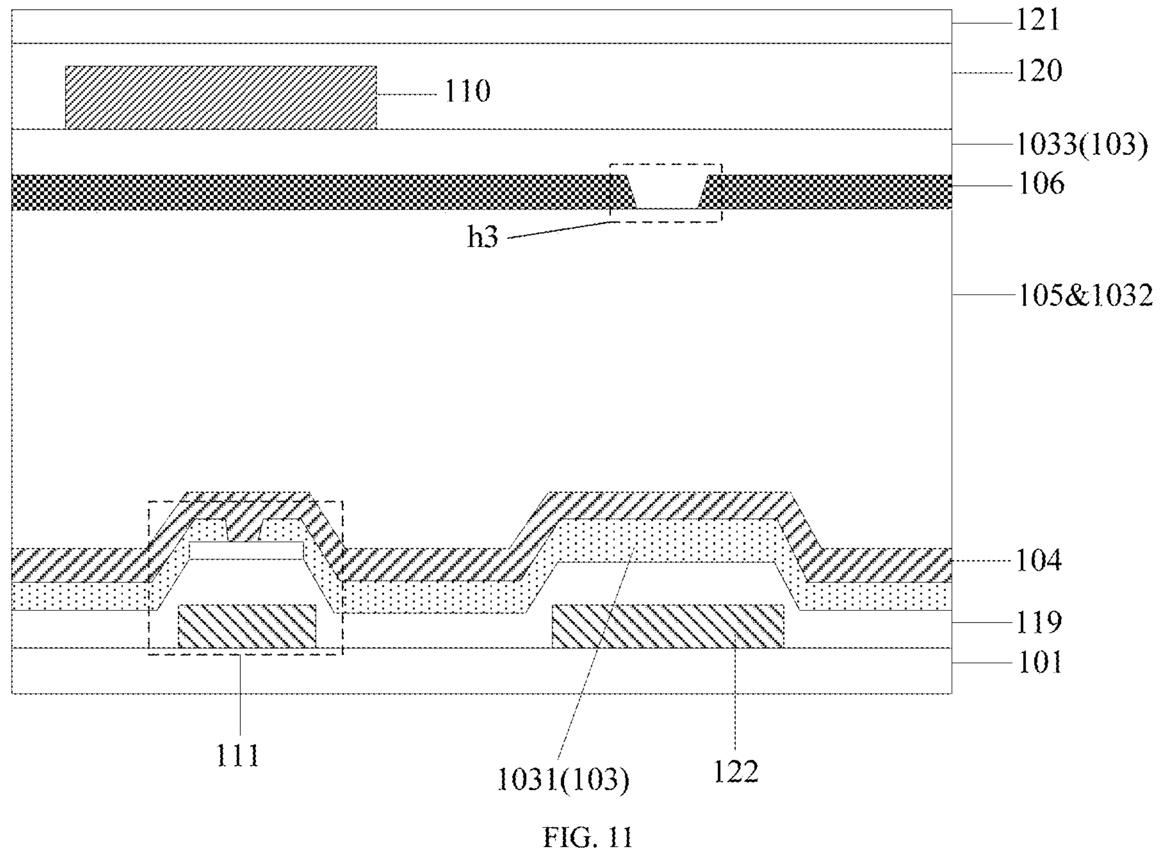
FIG. 11 is another section view along line I-II in FIG. 2.

In some embodiments, in the above line recognition substrate provided by the embodiments of the present disclosure, as shown in FIG. 11, the second insulating layer 106 may include a third via hole h3, and the fourth electrode 1033 fills the third via hole h3. The planarization layer 105 may be separated from the third electrode 1031 by the first insulating layer 104, and the planarization layer 105 may contact with the fourth electrode 1033 through the third via hole h3. In this case, the planarization layer 105 may be multiplexed as the equivalent dielectric layer 1032, and since the material of the planarization layer 105 does not have a photoelectric conversion function, it may be guaranteed that the dummy device 103 cannot perform photoelectric conversion. Moreover, the planarization layer 105 in the related art is multiplexed as the equivalent dielectric layer 1032 may avoid making the equivalent dielectric layer 1032 separately, thereby simplifying the preparation process, improving production efficiency, and saving production costs.

Figure 12:
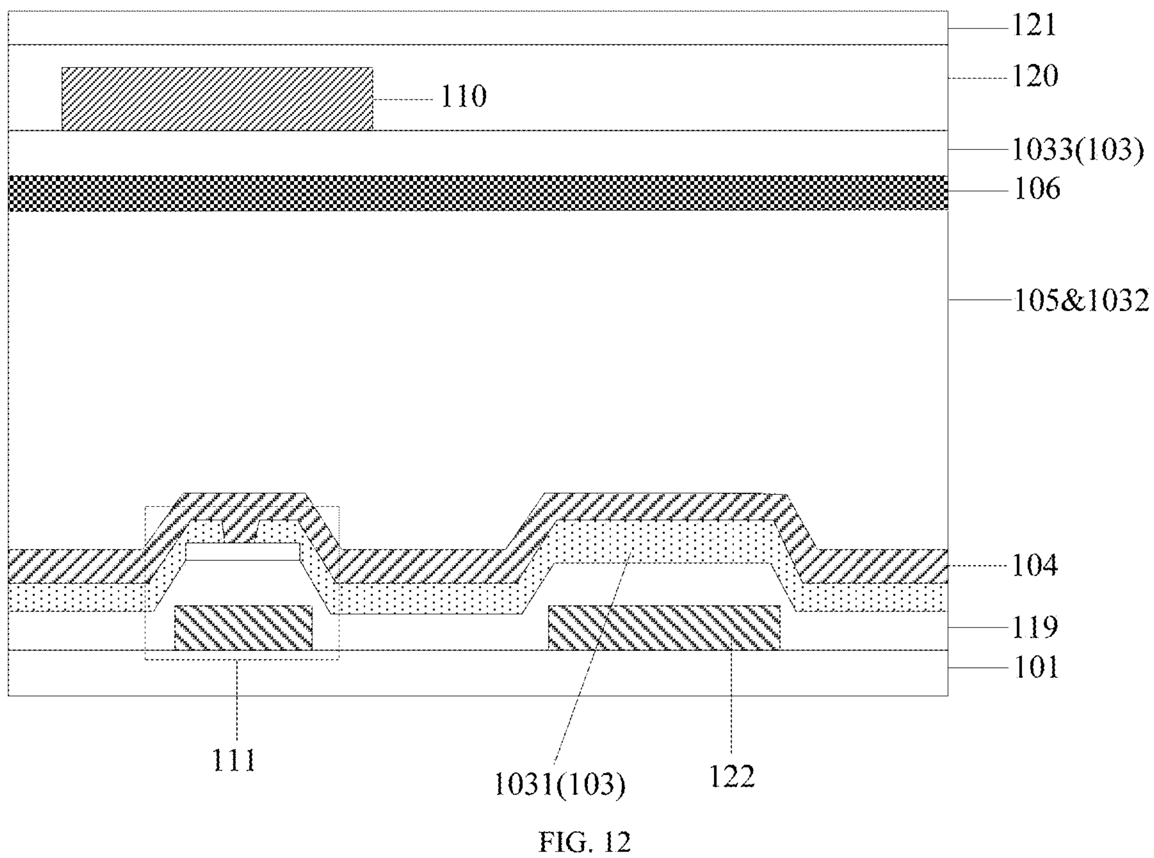
FIG. 12 is another section view along line I-II in FIG. 2.

In some embodiments, in the above line recognition substrate provided by the embodiments of the present disclosure, as shown in FIG. 12, the planarization layer 105 may be separated from the third electrode 1031 by the first insulating layer 104, and the planarization layer 105 may be separated from the fourth electrode 1033 by the second insulating layer 106. In this case, the planarization layer 105 can be multiplexed as the equivalent dielectric layer 1032, and since the material of the planarization layer 105 does not have a photoelectric conversion function, it can be guaranteed that the dummy device 103 cannot perform photoelectric conversion. Moreover, multiplexing the planarization layer 105 in the related art as the equivalent dielectric layer 1032 avoids making the equivalent dielectric layer 1032 separately, thereby simplifying the preparation process, improving production efficiency, and saving production costs.

Figure 13:
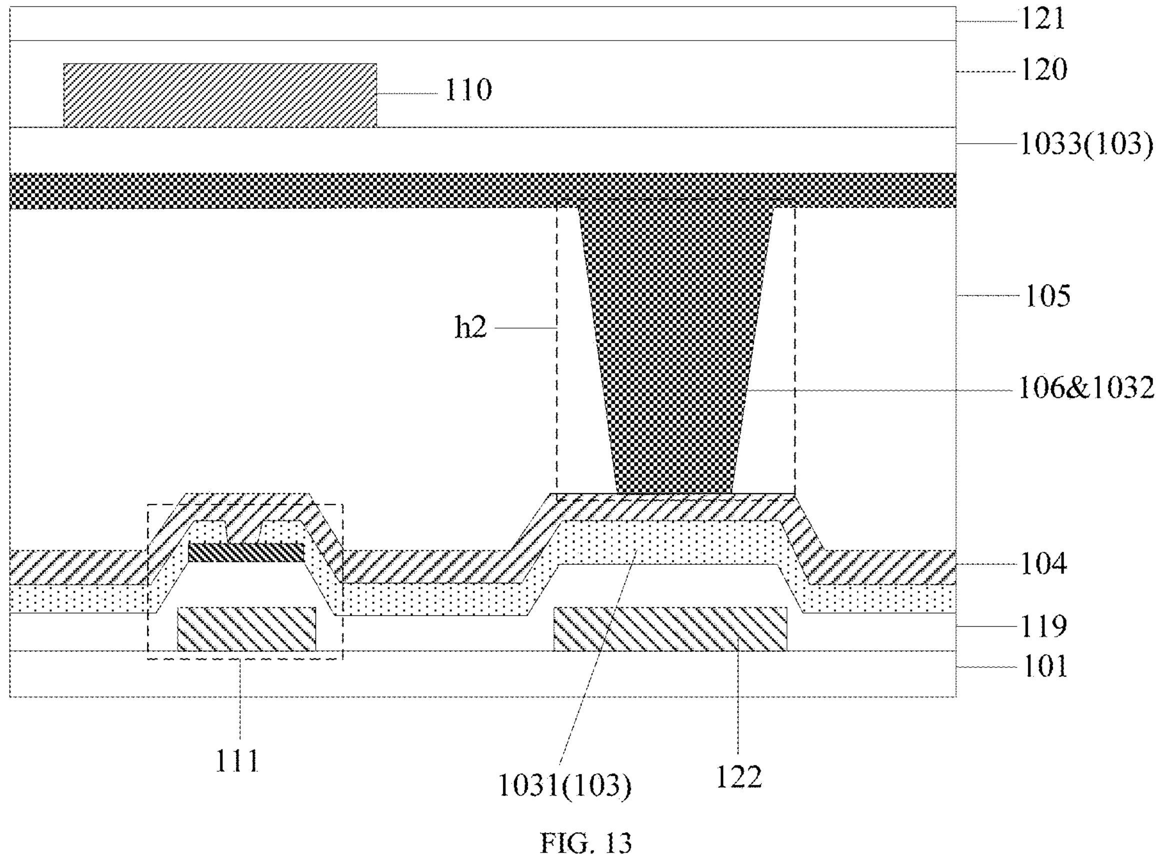
FIG. 13 is another section view along line I-II in FIG. 2.

In some embodiments, in the above line recognition substrate provided by the embodiments of the present disclosure, as shown in FIG. 13, at the light-shielding region D, the planarization layer 105 may include a second via hole h2, and the second insulating layer 106 may fill the second via hole h2. The second insulating layer 106 may be separated from the third electrode 1031 by the first insulating layer 104, and the second insulating layer 106 may directly contact with the fourth electrode 1033. In this case, the second insulating layer 106 may be multiplexed as the equivalent dielectric layer 1032, and since the material of the second insulating layer 106 does not have a photoelectric conversion function, it may be guaranteed that the dummy device 103 cannot perform photoelectric conversion. Moreover, multiplexing the second insulating layer 106 in the related art as the equivalent dielectric layer 1032 avoids making the equivalent dielectric layer 1032 separately, to simplify the preparation process, improve production efficiency, and save production costs.

Figure 14:
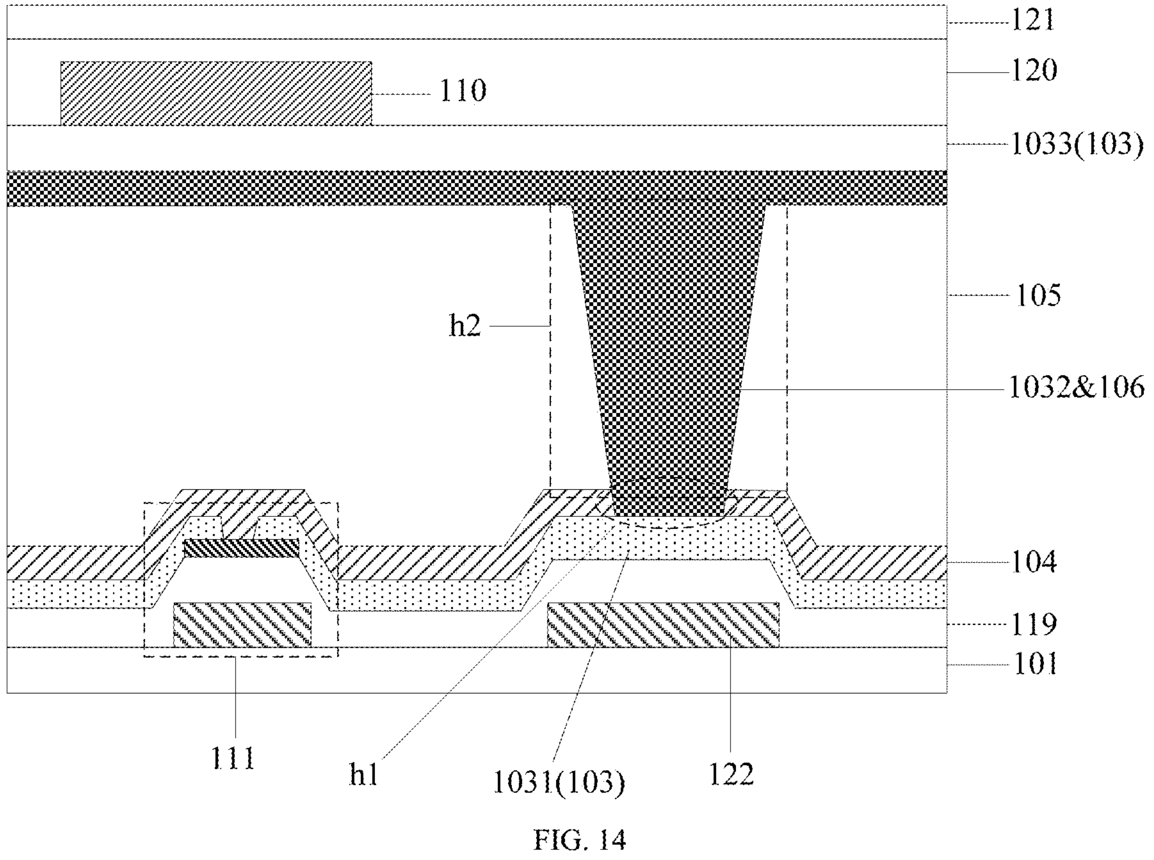
FIG. 14 is another section view along line I-II in FIG. 2.

In some embodiments, in the above line recognition substrate provided by the embodiments of the present disclosure, as shown in FIG. 14, at the light-shielding region D, the first insulating layer 104 may include a first via hole h1, the planarization layer 105 may include a second via hole h2, the first via hole h1 communicates with the second via hole h2, and the second insulating layer 106 may fill the first via hole h1 and the second via hole h2. The second insulating layer 106 may contact with the third electrode 1031 through the first via hole h1 and the second via hole h2, and the second insulating layer 106 may directly contact with the fourth electrode 1033. In this case, the second insulating layer 106 may be multiplexed as the equivalent dielectric layer 1032, and since the material of the second insulating layer 106 does not have a photoelectric conversion function, it may be guaranteed that the dummy device 103 cannot perform photoelectric conversion. Moreover, multiplexing the second insulating layer 106 in the related art as the equivalent dielectric layer 1032 avoids elemental preparation of the equivalent dielectric layer 1032, thereby simplifying the preparation process, improving production efficiency, and saving production costs.

In some embodiments, the above line recognition substrate provided by the embodiments of the present disclosure, as shown in FIGS. 3-14, further includes a bias wire 107 located at a side of the second insulating layer 106 facing away from the base substrate 101. The fourth electrode 1033 and the bias wire 107 may be located at the same layer and made of the same material, and the third electrode 1031 and the first electrode 1021 may be located at the same layer and made of the same material, so as to save the mask process, save production costs, and improve production efficiency.

Figure 3:
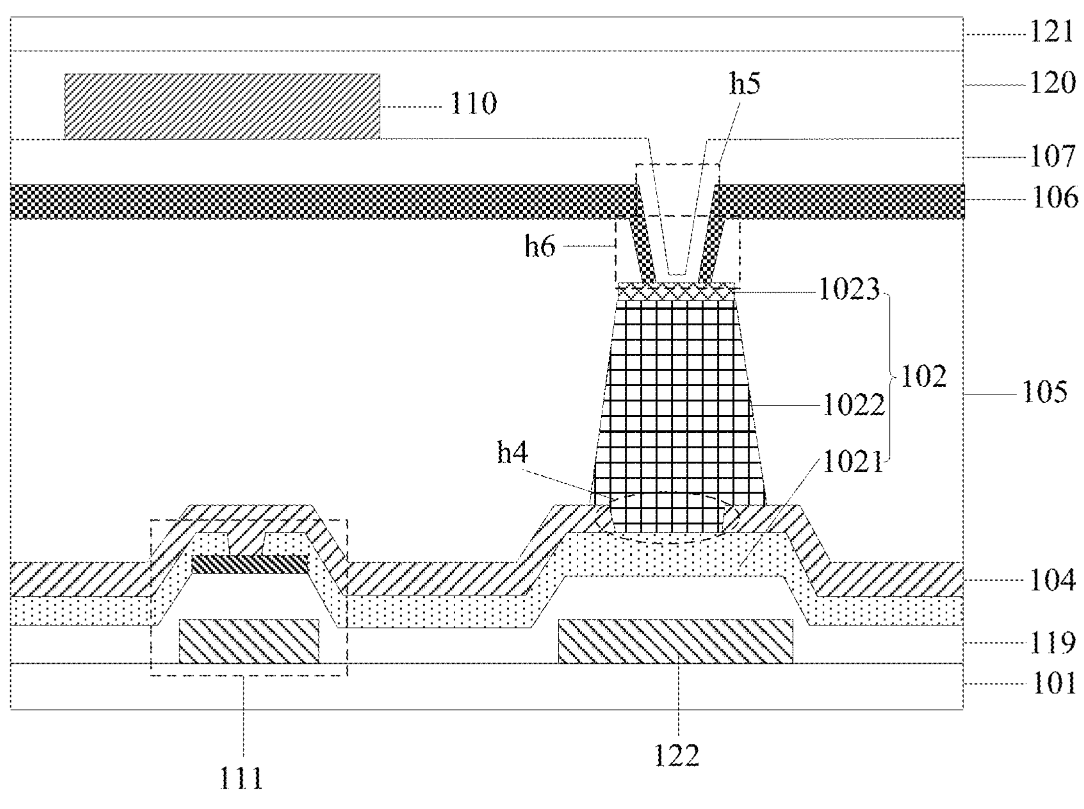
FIG. 3 is a section along line I-II in FIG. 2.

In some embodiments, in the above line recognition substrate provided by the embodiments of the present disclosure, as shown in FIG. 3, at the photosensitive region AA, the first insulating layer 104 may include a fourth via hole h4, the second insulating layer 106 may include a fifth via hole h5, the planarization layer 105 may include a sixth via hole h6, and the fifth via hole h5 communicates with the sixth via hole h6.

The photoelectric conversion structure 1022 is electrically connected with the first electrode 1021 through the fourth via hole h4, and the second electrode 1023 is electrically connected with the bias wire 107 through the fifth via hole h5 and the sixth via hole h6.

In specific implementation, the bias wire 107 loads bias voltage for the second electrode 1023, and the reflected light from the finger is converted into carriers by the photoelectric conversion structure 1022. Electron-hole pairs contained in the carriers drift toward the first electrode 1021 and the second electrode 1023 respectively under the action of an electric field, and are collected by the first electrode 1021 and the second electrode 1023 to generate current signals, and then fingerprint recognition can be performed according to the current signals.

Figure 15:
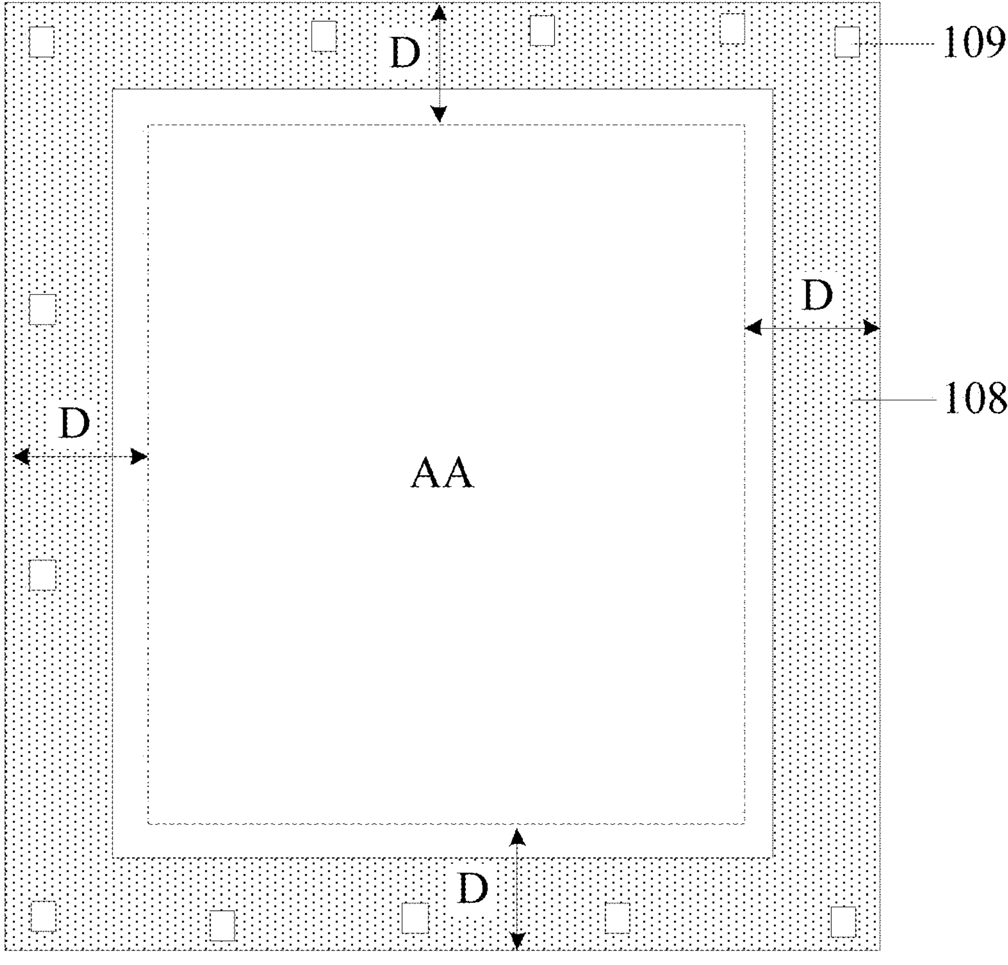
FIG. 15 is another schematic structural diagram of a line recognition substrate according to an embodiment of the present disclosure.
Figure 16:
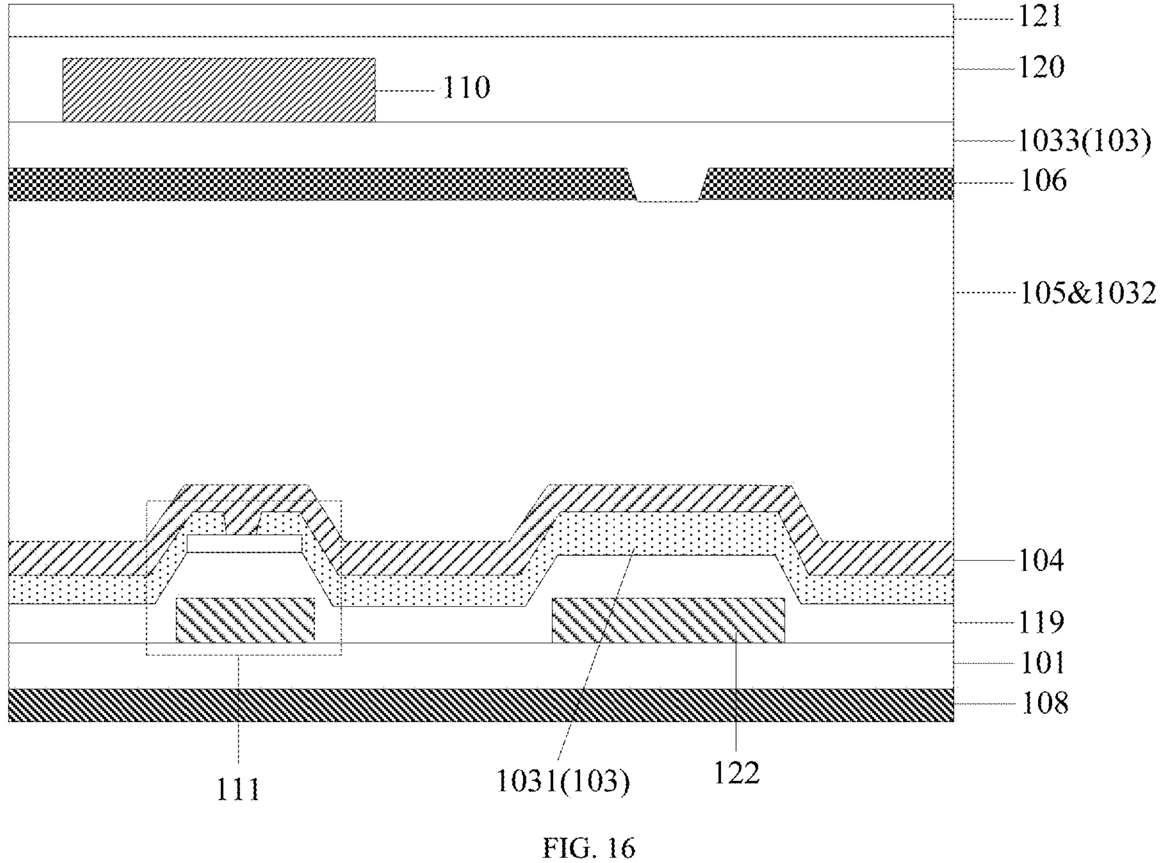
FIG. 16 is a section view of a region where a dummy device shielded by a light-shielding layer and a transistor electrically connected thereto are located in FIG. 15.

In some embodiments, the above line recognition substrate provided by the embodiments of the present disclosure, as shown in FIGS. 15 and 16, further includes a light-shielding layer 108 located at a side of the base substrate 101 facing away from a layer on which the plurality of dummy devices 103 are located. The light-shielding layer 108 covers at least one row (column/line) of the dummy devices 103 to prevent emitted light from a backlight module included in the line recognition apparatus from irradiating the dummy devices 103 to avoid interfering the imaging quality.

In some embodiments, a material of the light-shielding layer 108 may be a material having a large optical density (OD) value (e.g., greater than 5), such as black ink, so as to ensure that no light passes through the light-shielding layer 108 to irradiate the dummy devices 103 shielded thereby.

In some embodiments, in the above line recognition substrate provided by the embodiments of the present disclosure, the light-shielding layer 108 may be formed by silk-screening printing black ink, and a row of dummy devices 103 (i.e., a line/column of dummy devices 103) adjacent to the photosensitive region AA are allowed to be exposed taking into account a tolerance of the actual silk-screening printing, so that the light-shielding region D can be largely shielded without shielding the photosensitive region AA. That is, the light-shielding layer 108 may cover other rows of dummy devices 103 except the row of dummy devices 103 adjacent to the photosensitive region AA.

In some embodiments, the above line recognition substrate provided by the embodiments of the present disclosure, as shown in FIG. 15, may further include: an alignment marker 109 that is located at the light-shielding region D, and is generally configured to bond a flexible printed circuit (FPC) and a gate driver IC (Gate IC). The light-shielding layer 108 may include a hollowed structure exposing the alignment markers 109, so as to facilitate bonding of the flexible printed circuit (FPC) and the gate driver IC (Gate IC) in the subsequent process.

In some embodiments, the above line recognition substrate provided by the embodiments of the present disclosure, as shown in FIGS. 3 to 14, 16, and 18, may further include a light-shielding metal layer 110 and a transistor 111; the light-shielding metal layer 110 may be located at a side, facing away from the base substrate 101, of a layer on which the fourth electrode 1033 is located, and the transistor 111 may be located between a layer on which the photoelectric conversion structure 1022 is located and the base substrate 101, and source and drain electrodes of the transistor 111 may be electrically connected with the first electrode 1021 or the third electrode 1031.

An orthographic projection of the light-shielding metal layer 110 on the base substrate 101 overlays an orthographic projection of the transistor 111 on the base substrate 101, and the orthographic projection of the light-shielding metal layer 110 on the base substrate 101 does not overlap with orthographic projections of the dummy device 103 and the photo sensor 102 on the base substrate 101.

Since no light is received by the transistors 111 shielded by the light-shielding metal layer 110, the influences of the illumination noise on the transistors 111 in the light-shielding region D and the photosensitive region AA are directly filtered out. In addition, since the dummy devices 103 in the light-shielding region does not perform photoelectric conversion, the output current in the light-shielding region D is caused by the transverse noise of the transistors 111. Based on this, the output current of the photo sensors 102 in the photosensitive region AA may be calibrated using the output current of the dummy devices 103 in the light-shielding region D as a reference value, which filters out the transverse noise and the illumination noise, thereby improving fingerprint imaging quality.

In addition, the light-shielding metal layer 110 is not disposed above the dummy devices 103 in the light-shielding region D to prevent the problem that the emitted light from the backlight module is reflected by the light-shielding metal layer 110 to the adjacent photosensitive region AA when reaching above the dummy devices 103, so as to make the edge of the photosensitive region AA excessively bright to affect the fingerprint imaging quality.

Figure 2:
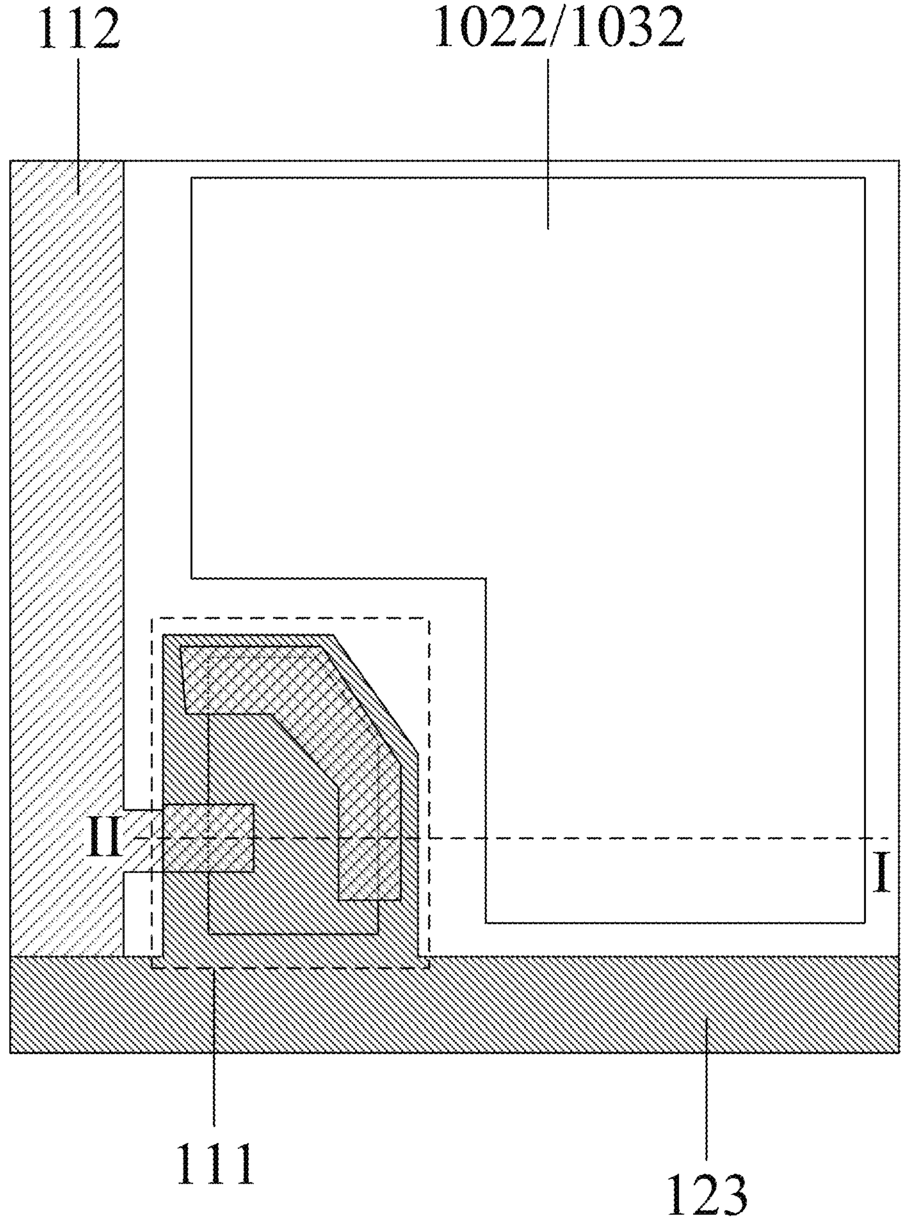
FIG. 2 is a schematic diagram showing an enlarged structure of a region Z1 or Z2 in FIG. 1.

In some embodiments, as shown in FIG. 2, the transistor 111 may be an "inverted L" in shape, and such a design may reduce the capacitance of the transistor 111 in an extension direction of a data line 112, thereby reducing noise. In addition, as shown in FIG. 3, the light-shielding metal layer 110 may directly contact with the bias wire 107 to reduce the resistance of the bias wire 107.

Figure 17:
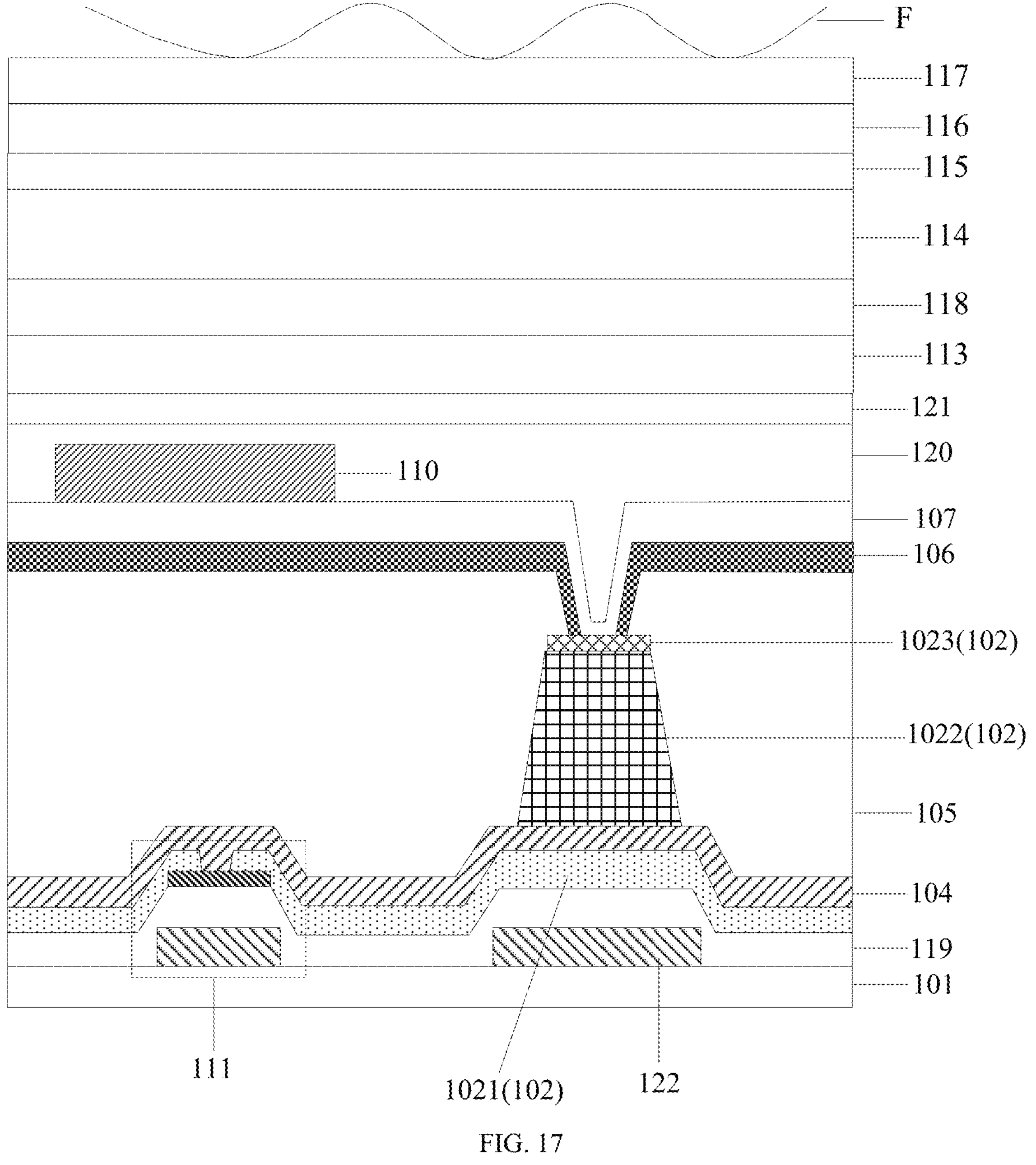
FIG. 17 is another section view along line I-II in FIG. 2.
Figure 18:
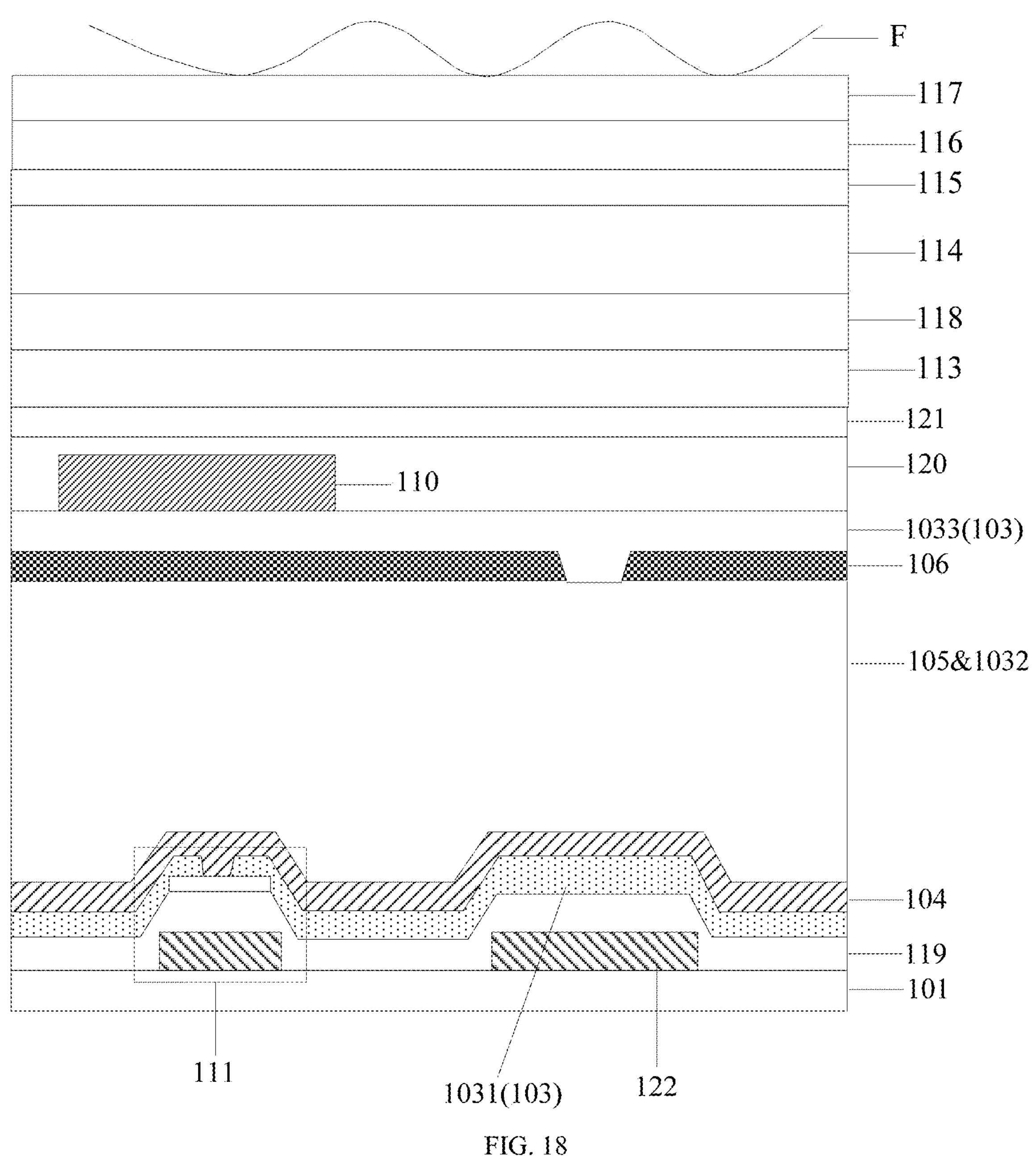
FIG. 18 is another section view along line I-II in FIG. 2.

In some embodiments, the above line recognition substrate provided by the embodiments of the present disclosure, as shown in FIGS. 17 and 18, may further include an absorption type cut-off coating 113, an optical fiber layer 114, an electrostatic discharge electrode 115, a harding coating 116, and an anti-fingerprint coating (AF) 117 disposed on a side of the light-shielding metal layer 110 facing away from the base substrate in sequence.

It should be noted that, the wavelength of light transmitting through the absorption type cut-off coating 113 needs to be consistent with the emission wavelength of a light source, and a blue light source with greater light intensity is preferred in the present disclosure. Accordingly, the absorption type cut-off coating 113 selectively transmits blue light, and light with other wavelengths is cut off. Preferably, the transmittance of the absorption type cut-off coating 113 to light with the cut-off wavelength can be less than 3%. In some embodiments, the absorption type cut-off coating 113 can use blue resin, a blue ink, or the like. There is no clear definition on the material in the present disclosure as long as it is guaranteed that the transmission meets the requirements.

In addition, the optical fiber layer 114 may increase the hardness of the product. In specific implementation, the absorption type cut-off coating 113 can be attached to the optical fiber layer 114 by an optically clear adhesive (OCA) 118. Optionally, the thickness of the optically clear adhesive 118 may be less than 25 μm. The electrostatic discharge electrode 115 may be grounded to improve the electrostatic discharge (ESD) resistance capability of the product. Optionally, the electrostatic discharge electrode 115 is made of transparent materials such as indium tin oxide (ITO) or indium zinc oxide (IZO) to improve light transmission efficiency. In specific implementation, the harding coating 116 may be made using silicon oxide ($SiO_2$), silicon carbide (SiC), or a combination thereof, such that the overall hardness of the product can reach 9 H, greatly enhancing the scratch resistance of the product. Since the finger needs to repeatedly touch the surface of the product, and fingerprint residue may affect fingerprint acquisition, the outermost surface of the product may be coated with the anti-fingerprint coating 117 to prevent the fingerprint residue and improve the fingerprint acquisition effect.

In some embodiments, the above line recognition substrate provided by the embodiments of the present disclosure, as shown in FIGS. 1 to 14, and 16 to 18, may further include a gate insulating layer 119, a second planarization layer 120, a protective layer 121, a light-shielding structure 122, and a gate line 123. Other components essential to the line recognition substrate will be understood by those of ordinary skill in the art, which will not be repeated herein and should not be taken as a limitation on the present disclosure.

Figure 19:
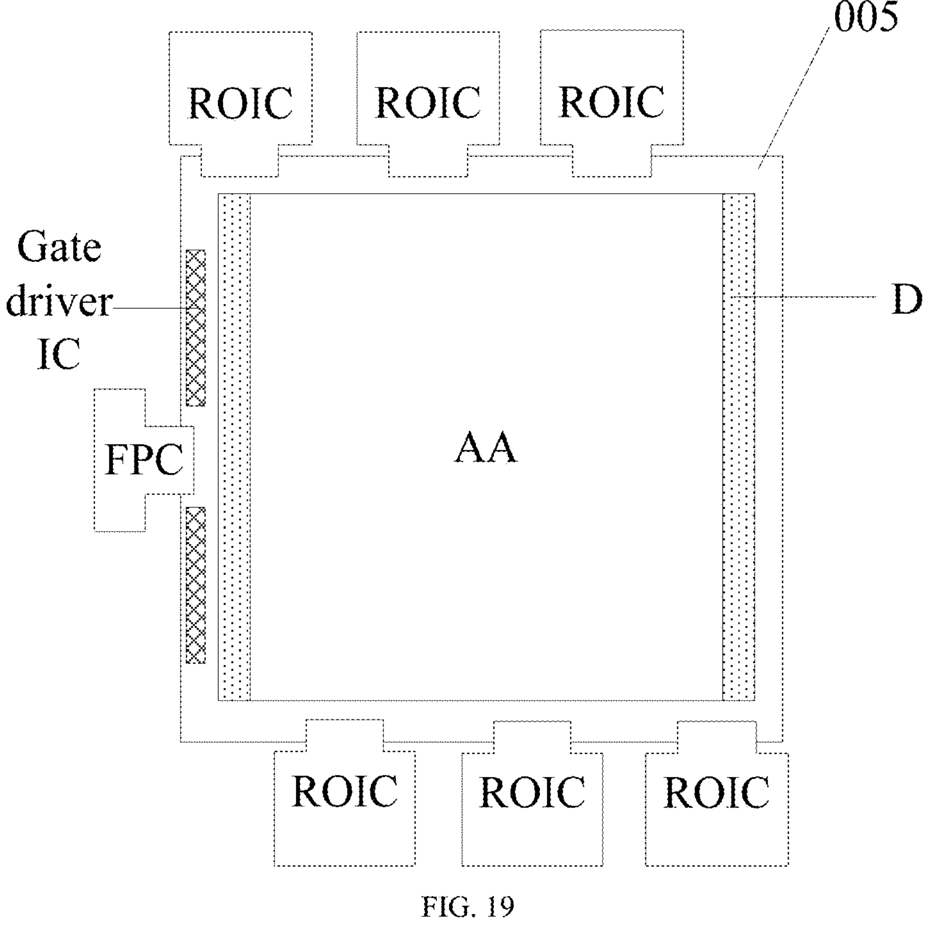
FIG. 19 is another schematic structural diagram of a line recognition substrate according to an embodiment of the present disclosure.
Figure 20:
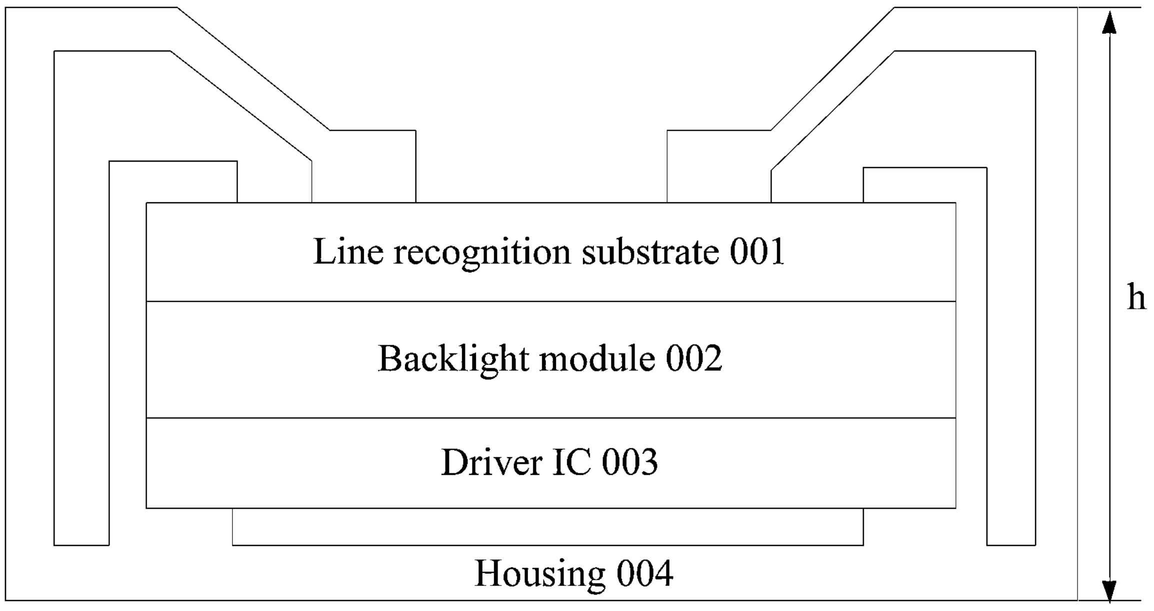
FIG. 20 is a schematic structural diagram of a line recognition apparatus according to an embodiment of the present disclosure.

In view of the same inventive concept, the embodiments of the present disclosure also provide a line recognition apparatus, as shown in FIGS. 19 and 20, which may include a line recognition substrate 001 and a backlight module 002, the line recognition substrate 001 is the above line recognition substrate, and the line recognition substrate 001 is located at a light emitting side of the backlight module 002.

Since the principle of solving the problems of the line recognition apparatus is similar to the principle of solving the problems of the above line recognition substrate 001, the implementation of the line recognition apparatus provided by the embodiments of the present disclosure can refer to the implementation of the above line recognition substrate provided by the embodiments of the present disclosure, and the repeated parts will not be described in detail.

In some embodiments, the above line recognition apparatus provided by the embodiments of the present disclosure, as shown in FIGS. 19 and 20, may further include a driver chip (FPGA) 003 which may be located at a side of the backlight module 002 facing away from the line recognition substrate 001, and the driver chip 003 is electrically connected with the backlight module 002 and the line recognition substrate 001, respectively. In specific implementation, the driver chip 003 controls a readout integrated circuit (ROIC), a flexible printed circuit (FPC), and a gate driver chip (Gate IC) of the line recognition substrate 001 to drive the photo sensors 102 and the dummy devices 103 to operate. Meanwhile, the backlight module 002 is also controlled by the driver chip 003 to output light with different light intensities. The emitted light from the backlight module 002 passes through the line recognition substrate 001 to reach a finger F, and the light reflected from the finger F enters the photoelectric conversion structure 1022 and is converted into electrical signals, thereby achieving recognition of the valleys and ridges of the fingerprint.

In some embodiments, the above line recognition apparatus provided by the embodiments of the present disclosure, as shown in FIGS. 19 and 20, may further include a housing 004 which encloses the driver chip 003, the backlight module 002, and the line recognition substrate 001 to achieve a protective effect on the driver chip 003, the backlight module 002, and the line recognition substrate 001. Moreover, the housing 004 contacts with the light-shielding region D of the line recognition substrate 001 at a side of the line recognition substrate 001 facing away from the backlight module 002, i.e., the photosensitive region AA of the line recognition substrate 001 is in a windowing state, thereby ensuring that the photosensitive region AA receives the reflected light from the fingerprint, and meanwhile preventing interference from ambient light around. In a specific implementation, the housing 004 can be bonded to the light-shielding region D of the line recognition substrate 001 by a black frame adhesive 005.

In some embodiments, in the above line recognition apparatus provided by the embodiments of the present disclosure, as shown in FIG. 20, a sum h of the thicknesses of the housing 004, the backlight module 002, and the line recognition substrate 001 in a direction of the backlight module 002 is directed to the line recognition substrate 001 may be 6 mm to 10 mm.

At present, prismatic optical fingerprint collectors are commonly used in the market. After light emitted from a backlight source passes through a prism to irradiate the finger and then is reflected by the finger, light reflected from the finger passes through the prism again to irradiate the photo sensor PS for photoelectric conversion, thereby achieving fingerprint recognition. Such a prismatic optical fingerprint collector is capable of recognizing fingerprints under high light, but is bulky and inconvenient to carry. The thickness of the above line recognition apparatus provided by the embodiments is 6 mm-10 mm, which is 10 times less than the thickness of the existing prismatic optical fingerprint collector, such that the line recognition apparatus in the present disclosure has portability. In addition, the luminance-tunable range of the backlight module 002 and the area of the photoelectric conversion structure 1022 in the present disclosure are large, and thus the above line recognition apparatus provided by the present disclosure can also perform line recognition under high light conditions such as outdoors.

As can be seen from the above description, the above line recognition substrate and line recognition apparatus provided by the embodiments of the present disclosure can ensure that the dummy devices 103 in the light-shielding region D only collect dark noise without being affected by ambient light and emitted light from the backlight module, which is advantageous in reducing noise in various application environments and improving the fingerprint imaging quality.

Apparently, those skilled in the art can perform various modifications and variations on the embodiments of the present disclosure without departing from the spirit and scope of the embodiments of the present disclosure. Thus, if these modifications and variations of the embodiments fall within the scope of the appended claims of the present disclosure and equivalents thereof, the present disclosure is also intended to include these modifications and variations.

What is claimed is:

1. A line recognition substrate, comprising:

a base substrate, comprising a photosensitive region and a light-shielding region, the light-shielding region is located on at least one side of the photosensitive region;

a plurality of photo sensors, arranged in an array at the photosensitive region, each photo sensor comprising a first electrode, a photoelectric conversion structure, and a second electrode arranged in layers, wherein the photoelectric conversion structure is electrically connected with the first electrode and the photoelectric conversion structure directly contacts with the second electrode; and a plurality of dummy devices, arranged in an array at the light-shielding region, each dummy device comprising a third electrode, an equivalent dielectric layer, and a fourth electrode, wherein the third electrode and the first electrode are located at the same layer, the fourth electrode is located at a side, facing away from the base substrate, of a layer on which the second electrode is located, the equivalent dielectric layer is disposed between a layer on which the third electrode is located and a layer on which the fourth electrode is located, and the plurality of dummy devices are configured to not perform photoelectric conversion.

2. The line recognition substrate of claim 1, further comprising: a first insulating layer, a planarization layer, and a second insulating layer; wherein the first insulating layer is disposed between the equivalent dielectric layer and the layer on which the third electrode is located, the second insulating layer is disposed between the equivalent dielectric layer and the layer on which the fourth electrode is located; and the planarization layer is disposed between the first insulating layer and the second insulating layer.

3. The line recognition substrate of claim 2, wherein the equivalent dielectric layer is separated from at least one of the third electrode or the fourth electrode.

4. The line recognition substrate of claim 3, wherein;

at the light-shielding region, the first insulating layer comprises a first via hole, the planarization layer comprises a second via hole, and the second insulating layer fills the second via hole; and the equivalent dielectric layer contacts with the third electrode through the first via hole, and the equivalent dielectric layer is separated from the fourth electrode by the second insulating layer; or, at the light-shielding region, the planarization layer comprises a second via hole, and the second insulating layer fills the second via hole; and the equivalent dielectric layer is separated from the third electrode by the first insulating layer, and the equivalent dielectric layer is separated from the fourth electrode by the second insulating layer; or at the light-shielding region, the first insulating layer comprises a first via hole; and the equivalent dielectric layer contacts with the third electrode through the first via hole, and the equivalent dielectric layer is separated from the fourth electrode by the planarization layer and the second insulating layer; or the equivalent dielectric layer is separated from the third electrode by the first insulating layer, and the equivalent dielectric layer is separated from the fourth electrode by the planarization layer and the second insulating layer; or, at the light-shielding region, the second insulating layer comprises a third via hole, and the fourth electrode fills the third via hole; and the equivalent dielectric layer is separated from the third electrode by the first insulating layer, and the equivalent dielectric layer is separated from the fourth electrode by the planarization layer.

5. The line recognition substrate of claim 2, wherein a dielectric constant of the equivalent dielectric layer is approximately the same as a dielectric constant of the photoelectric conversion structure.

6. The line recognition substrate of claim 5, wherein the equivalent dielectric layer and the photoelectric conversion structure are located at a same layer and made of a same material.

7. The line recognition substrate of claim 5, wherein the equivalent dielectric layer and the photoelectric conversion structure are located at a same layer, but made of different materials, and the dielectric constant of the equivalent dielectric layer is 10-15.

8. The line recognition substrate of claim 2, wherein at the light-shielding region, the first insulating layer comprises a first via hole, the second insulating layer comprises a third via hole, and the fourth electrode fills the third via hole; and the planarization layer contacts with the third electrode through the first via hole, and the planarization layer contacts with the fourth electrode by the third via hole.

9. The line recognition substrate of claim 8, wherein the planarization layer is multiplexed as the equivalent dielectric layer.

10. The line recognition substrate of claim 2, wherein at the light-shielding region, the first insulating layer comprises a first via hole; and the planarization layer contacts with the third electrode through the first via hole, and the planarization layer is separated from the fourth electrode by the second insulating layer.

11. The line recognition substrate of claim 2, wherein at the light-shielding region, the second insulating layer comprises a third via hole, and the fourth electrode fills the third via hole; and the planarization layer is separated from the third electrode by the first insulating layer, and the planarization layer contacts with the fourth electrode through the third via hole.

12. The line recognition substrate of claim 2, wherein at the light-shielding region, the planarization layer is separated from the third electrode by the first insulating layer, and the planarization layer is separated from the fourth electrode by the second insulating layer.

13. The line recognition substrate of claim 2, wherein at the light-shielding region, the planarization layer comprises a second via hole, and the second insulating layer fills the second via hole; and the second insulating layer is separated from the third electrode by the first insulating layer, and the second insulating layer directly contacts with the fourth electrode; or wherein at the light-shielding region, the first layer comprises a first via hole, the planarization layer comprises cond via hole, the first via hole communicates with the second via hole. and the second insulating layer fills the first via hole and the second via hole; and the second insulating layer contacts with the third electrode through the first via hole and the second via hole, and the second insulating layer directly contacts with the fourth electrode.

14. The line recognition substrate of claim 13, wherein the second insulating layer is multiplexed as the equivalent dielectric layer.

15. The line recognition substrate of claim 2, further comprising a bias wire located at a side of the second insulating layer facing away from the base substrate, wherein the fourth electrode and the bias wire are located at a same layer and made of a same material, and the third electrode and the first electrode are made of a same material.

16. The line recognition substrate of claim 1, further comprising a light-shielding layer disposed at a side of the base substrate facing away from a layer where the plurality of dummy devices are located, wherein the light-shielding layer covers at least one row of the dummy devices.

17. The line recognition substrate of claim 16, wherein the light-shielding layer covers other rows of the dummy devices except one row of the dummy devices adjacent to the photosensitive region.

18. The line recognition substrate of claim 16, further comprising: an alignment marker located at the light-shielding region; and the light-shielding layer comprises a hollowed structure exposing the alignment marker.

19. The line recognition substrate of claim 16, further comprising a light-shielding metal layer and a transistor, wherein the lighting shielding metal layer is located at a side, facing away from the base substrate, of a layer on which the fourth electrode is located, the transistor is located between a layer on which the photoelectric conversion structure is located and the base substrate, and source and drain electrodes of the transistor are electrically connected with the first electrode or the third electrode;

an orthographic projection of the light-shielding metal layer on the base substrate overlays an orthographic projection of the transistor on the base substrate, and the orthographic projection of the light-shielding metal layer on the base substrate does not overlap with orthographic projections of the dummy device and the photo sensor on the base substrate.

20. A line recognition apparatus, comprising a backlight module and a line recognition substrate, wherein the line recognition substrate is the line recognition substrate of claim 1, and the line recognition substrate is located at a light emitting side of the backlight module.

* * * * *